US012588561B2

(12) United States Patent　　　(10) Patent No.:　US 12,588,561 B2
Kim　　　　　　　　　　　　　　　　　(45) Date of Patent:　　Mar. 24, 2026

(54) LIGHT EMITTING DISPLAY DEVICE

(71) Applicant: Samsung Display Co., Ltd., Yongin-si (KR)

(72) Inventor: Keun Woo Kim, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 407 days.

(21) Appl. No.: 18/130,612

(22) Filed: Apr. 4, 2023

(65) Prior Publication Data

US 2023/0317701 A1　　Oct. 5, 2023

(30) Foreign Application Priority Data

Apr. 5, 2022　(KR) ........................ 10-2022-0042442

(51) Int. Cl.
H01L 25/16　　　(2023.01)
H01L 25/075　　(2006.01)
(Continued)

(52) U.S. Cl.
CPC ........ H01L 25/167 (2013.01); H01L 25/0753 (2013.01); H10D 86/441 (2025.01); H10D 86/60 (2025.01); H10H 20/857 (2025.01)

(58) Field of Classification Search
None
See application file for complete search history.

(56) References Cited

U.S. PATENT DOCUMENTS 10,482,817 B2　11/2019　Kim et al.
2018/0122298 A1　5/2018　Lee et al.
(Continued)

FOREIGN PATENT DOCUMENTS

EP　　　　3316303 A1　5/2018
KR　1020180064619 A　6/2018
(Continued)

OTHER PUBLICATIONS

Extended European Partial Search Report—European Patent Application No. 23166817.9 dated Jul. 25, 2023, citing references listed within.

(Continued)

*Primary Examiner* — William C Trapanese
(74) *Attorney, Agent, or Firm* — CANTOR COLBURN LLP

(57)　　　　　　ABSTRACT
A light emitting display device includes: a first pixel which displays a first color, and includes a first light emitting diode and a first pixel circuit portion connected to the first light emitting diode; and a second pixel which displays a second color, and includes a second light emitting diode and a second pixel circuit portion connected to the second light emitting diode. The first pixel circuit portion includes an initialization transistor which transmits an initialization voltage to the first light emitting diode, and the initialization transistor of the first pixel circuit portion includes a first gate electrode and a second gate electrode which receive a gate-on voltage. The second pixel circuit portion includes an initialization transistor which transmits the initialization voltage to the second light emitting diode, and the initialization transistor of the second pixel circuit portion includes a first gate electrode which receives the gate-on voltage.

19 Claims, 16 Drawing Sheets

(51) Int. Cl.
      *H10D 86/40*        (2025.01)
      *H10D 86/60*        (2025.01)
      *H10H 20/857*       (2025.01)

(56)                References Cited

U.S. PATENT DOCUMENTS

2019/0080649  A1      3/2019  Lee et al.
2021/0193049  A1      6/2021  Lin et al.
2021/0350740  A1     11/2021  Byun et al.
2022/0319419  A1*    10/2022  Xiang  ................. G09G 3/3233

FOREIGN PATENT DOCUMENTS

KR     1020190042784  A     4/2019
KR     1020210111945  A     9/2021
KR     1020210112431  A     9/2021
WO        2022061892  A1    3/2022

OTHER PUBLICATIONS

Extended European Search Report for Application No. 23166817.
9-1210 dated Oct. 26, 2023.
Kim, et al. "Double-gate CMOS: symmetrical-versus asymmetrical-
gate devices" IEEE Transactions on Electron Devices, vol. 48, No.
2, Feb. 2001 pp. 294-299.

* cited by examiner

LIGHT EMITTING DISPLAY DEVICE

This application claims priority to Korean Patent Application No. 10-2022-0042442, filed on Apr. 5, 2022, and all the benefits accruing therefrom under 35 U.S.C. § 119, the content of which in its entirety is herein incorporated by reference.

BACKGROUND

(a) Field

This disclosure relates to a display device, and more particularly, the disclosure relates to a light emitting display device including light emitting diodes.

(b) Description of the Related Art

A light emitting display device may include light emitting diodes corresponding to pixels, and may display an image by controlling the brightness of each light emitting diode. Unlike a light-receiving display device such as a liquid crystal display (LCD), the light emitting display device does not include a separate light source such as a backlight, and thus thickness and weight thereof may be reduced. In addition, the light emitting display device has other desirable characteristics such as high luminance, high contrast ratio, high color reproduction, and high reaction speed, and therefore it can display high quality images.

Due to such desirable characteristics, the light emitting display device is being applied to various electronic devices such as mobile devices, monitors, and televisions, such as smartphones, tablets, and laptop computers, and has been spotlighted as a display device for automobiles.

SUMMARY

Embodiments are to provide a light emitting display device in which display quality deterioration due to the characteristic difference of pixels is effectively prevented or substantially reduced.

A light emitting display device according to an embodiment includes: a first pixel which displays a first color, where the first pixel includes a first light emitting diode and a first pixel circuit portion connected to the first light emitting diode; and a second pixel which displays a second color, where the second pixel includes a second light emitting diode and a second pixel circuit portion connected to the second light emitting diode. In such an embodiment, the first pixel circuit portion includes an initialization transistor which is connected to a first electrode of the first light emitting diode and transmits an initialization voltage, and the initialization transistor of the first pixel circuit portion includes a first gate electrode and a second gate electrode which receive a gate-on voltage.

In such an embodiment, the second pixel circuit portion includes an initialization transistor which is connected to a first electrode of the second light emitting diode and transmits the initialization voltage, and the initialization transistor of the second pixel circuit portion includes a first gate electrode which receives the gate-on voltage.

In an embodiment, the first gate electrode and the second gate electrode of the first pixel circuit portion may be electrically connected to each other.

In an embodiment, the first pixel circuit portion may further include a light emission control transistor which transmits a driving current to the first light emitting diode.

The initialization transistor and the light emission control transistor of the first pixel circuit portion may receive a same gate signal as each other.

In an embodiment, the initialization transistor of the first pixel circuit portion may be an N-type transistor, and the light emission control transistor may be a P-type transistor.

In an embodiment, the first pixel circuit portion may further include a driving transistor which adjusts an intensity of a driving current output to the first light emitting diode and a bias transistor which applies a bias voltage to the driving transistor. In such an embodiment, the initialization transistor and the bias transistor of the first pixel circuit portion may receive a same gate signal as each other.

In an embodiment, the initialization transistor and the bias transistor of the first pixel circuit portion may be P-type transistors.

In an embodiment, the first gate electrode and the second gate electrode of the first pixel circuit portion may be disposed above and below a semiconductor layer of the initialization transistor of the first pixel circuit portion, respectively.

In an embodiment, the light emitting display device may further include: a first insulation layer disposed between the first gate electrode of the first pixel circuit portion and the semiconductor layer of the initialization transistor of the first pixel circuit portion; and a second insulation layer disposed between the second gate electrode of the first pixel circuit portion and the semiconductor layer of the initialization transistor of the first pixel circuit portion, where the second insulation layer may be thicker than the first insulation layer.

In an embodiment, the first gate electrode of the second pixel circuit portion may be disposed above a semiconductor layer of the initialization transistor of the second pixel circuit portion.

In an embodiment, the initialization transistor of the second pixel circuit portion may further include a second gate electrode which is disposed below the semiconductor layer of the initialization transistor of the second pixel circuit portion and is in an electrically floating state.

In an embodiment, a light emitting region of the first pixel may be larger than a light emitting region of the second pixel In an embodiment, the light emitting display device may further include a third pixel which displays a third color, where the third pixel may include a third light emitting diode and a third pixel circuit portion connected to the third light emitting diode. In such an embodiment, the third pixel circuit portion may include an initialization transistor which is connected to a first electrode of the third light emitting diode and transmits the initialization voltage, and the initialization transistor of the third pixel circuit portion may include a second gate electrode which receives the gate-on voltage.

In an embodiment, the second gate electrode of the third pixel circuit portion may be disposed below a semiconductor layer of the initialization transistor of the third pixel circuit portion.

In an embodiment, the initialization transistor of the third pixel circuit portion may further include a first gate electrode which is disposed above the semiconductor layer of the initialization transistor of the third pixel circuit portion and is in an electrically floating state.

In an embodiment, a light emitting region of the third pixel may be smaller than a light emitting region of the second pixel.

A light emitting display device according to an embodiment includes a first pixel, a second pixel, and a third pixel which display different colors. In such an embodiment, each of the first pixel, the second pixel, and the third pixel includes a light emitting diode and a pixel circuit portion connected to the light emitting diode, and the pixel circuit portion includes a transistor which transmits an initialization voltage to the light emitting diode. In such an embodiment, the transistor of the first pixel includes an upper gate electrode and a lower gate electrode which are respectively disposed above and below a semiconductor layer thereof and receive a gate signal, the transistor of the second pixel includes an upper gate electrode which is disposed above a semiconductor layer thereof and receives the gate signal, and the transistor of the third pixel includes a lower gate electrode which is disposed below a semiconductor layer thereof and receives the gate signal.

In an embodiment, a capacitance of the light emitting diode of the first pixel may be greater than a capacitance of the light emitting diode of the second pixel. In such an embodiment, a capacitance of the light emitting diode of the second pixel may be greater than a capacitance of the light emitting diode of the third pixel.

In an embodiment, the light emitting display device may further include: an upper insulation layer disposed between the upper gate electrode of the transistor of the first pixel and the semiconductor layer of the transistor of the first pixel; and a lower insulation layer disposed between the lower gate electrode of the transistor of the first pixel and the semiconductor layer of the transistor of the first pixel, where the lower insulation layer may be thicker than the upper insulation layer.

In an embodiment, the transistor of the second pixel may further include a lower gate electrode which is disposed below the semiconductor layer of the transistor of the second pixel and is in an electrically floating state.

In an embodiment, the transistor of the third pixel may further include an upper gate electrode which is disposed above the semiconductor layer of the transistor of the third pixel and is in an electrically floating state.

According to embodiments of a light emitting display device, display quality deterioration due to the characteristic difference of pixels may be effectively prevented or substantially reduced.

DETAILED DESCRIPTION

Figure 1:
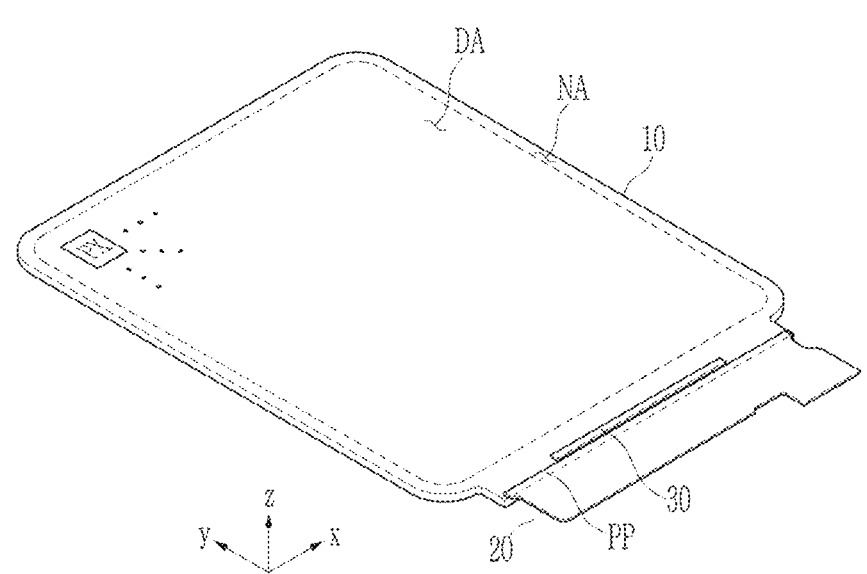
FIG. 1 is a schematic perspective view of a light emitting display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Throughout the specification, when "connected to" in the entire specification, this does not only mean that two or more constituent elements are directly connected, but also means that two or more constituent elements are indirectly connected, physically connected, and electrically connected through other constituent elements, or being referred to by different names depending on the position or function, while being integral.

In the drawings, the signs "x", "y", and "z" are used to indicate the direction, where "x" is a first direction, "y" is a second direction that is perpendicular to the first direction, and "z" is a third direction that is perpendicular to the first direction and the second direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

FIG. 1 is a schematic perspective view of a light emitting display device according to an embodiment.

Referring to FIG. 1, an embodiment of a light emitting display device (hereinafter, simply referred to as a display device) may be a device used to display images in electronic devices such as mobile phones, smart phones, tablets, laptop computers, monitors, multimedia players, and game machines. The display device may include a display panel 10, a flexible printed circuit board 20 bonded to the display panel 10, and driving units including an integrated circuit (IC) chip 30.

The display panel 10 may include a display area DA that corresponds to a screen where an image is displayed, and a non-display area NA where circuits and/or signal lines for generating and/or transmitting various signals applied to the display area DA are disposed. The non-display area NA may surround the display area DA. In FIG. 1, the area of the display panel 10 inside the dotted-lined quadrangle and the area of the display panel 10 outside the dotted-lined quadrangle may correspond to the display area DA and the non-display area NA, respectively.

Pixels PX may be disposed in a matrix form in the display area DA of the display panel 10. In addition, signal lines such as a gate line (also referred to as a scan line), a data line, and a driving voltage line may be disposed in the display area DA. The gate line may extend approximately in a first direction (x), and the data line and the driving voltage line may extend approximately in a second direction (y). A gate line, a data line, a driving voltage line, or the like are connected to each pixel PX, and each pixel PX may receive a gate signal (also referred to as a scan signal), a data voltage, a driving voltage, or the like from these signal lines. Each pixel PX may include a light emitting diode and a pixel circuit connected thereto. The pixel circuit portion may generate a driving current based on signals applied thereto through signal lines such as a gate line and a data line and apply the driving current to the light emitting diode.

A touch sensor for detecting a user's contact and/or non-contact touch may be disposed in the display area DA. FIG. 1 shows an embodiment where the display area DA is generally in the shape of a quadrangle, but not being limited thereto. Alternatively, the display area DA may have various shapes other than quadrangle, such as a polygon, a circle, and an oval.

In the non-display area NA of the display panel 10, a pad portion PP in which pads for receiving signals from an outside of the display panel 10 are arranged may be disposed. The pad portion PP may be disposed in the first direction (x) along one edge of the display panel 10. The flexible printed circuit board 20 may be bonded to the pad portion PP, and pads of the flexible printed circuit board 20 may be electrically connected to the pads of the pad portion PP.

In the non-display area NA of the display panel 10, a driving unit that generates and/or processes various signals for driving the display panel 10 may be disposed. The driving unit may include a data driver that applies a data voltage to data lines, a gate driver that applies a gate signal to gate lines, and a signal controller that controls the data driver and the gate driver. The pixels PX may receive a data voltage at predetermined timing in response to a gate signal generated by the gate driver. The gate driver may be integrated on the display panel 10 and disposed on at least one side of the display area DA. The data driver and the signal controller may be provided as an IC chip (also referred to as a driving IC chip) 30, and the IC chip 30 may be mounted on the non-display area NA of the display panel 10. The IC chip 30 may be mounted on the flexible printed circuit board 20 or the like, and electrically connected to the display panel 10.

Figure 2:
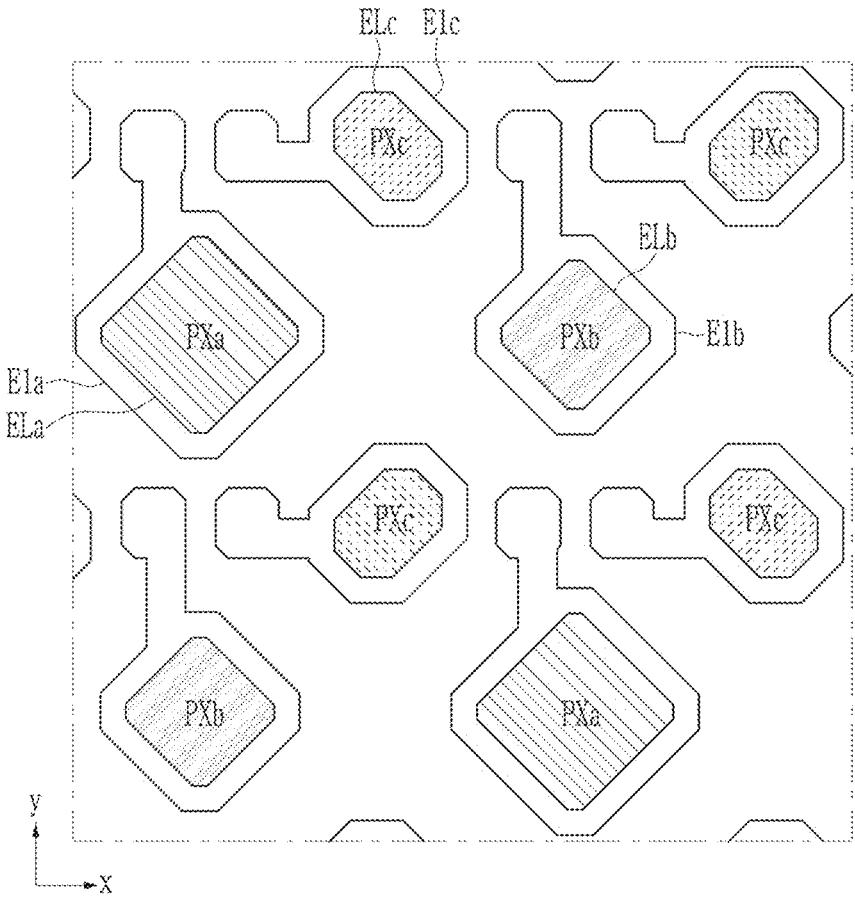
FIG. 2 is a schematic top plan view of pixels arranged in a display area in a light emitting display device according to an embodiment.

FIG. 2 is a schematic top plan view of pixels arranged in a display area in a light emitting display device according to an embodiment.

Referring to FIG. 2, an embodiment of pixels PXa, PXb, and PXc disposed in the display area DA of the display panel 10 are illustrated. The pixels PXa, PXb, and PXc may include a first pixel PXa, a second pixel PXb, and a third pixel PXc. Although 8 pixels are shown in FIG. 2, the pixels PXa, PXb, and PXc may be regularly or repeatedly disposed in a matrix form in the display area DA. In an embodiment, as shown in FIG. 2, the first pixel PXa and the second pixel PXb may be disposed alternately along the first direction (x) in even-numbered rows, and third pixels PXc may be disposed in odd-numbered rows. The arrangement of the pixels PXa, PXb, and PXc may be variously changed.

The first pixel PXa, the second pixel PXb, and the third pixel PXc may display different colors, and may each display one of the primary colors. In an embodiment, for example, one of first pixel PXa, second pixel PXb and third pixel PXc may display a red color, another thereof may display a green color, and the other thereof may display a blue color. In an embodiment, for example, the first pixel PXa may display a blue color, the second pixel PXb may display a red color, and the third pixel PXc may display a green color. In such an embodiment, a region of the first pixel PXa may be larger or wider than a region of the second pixel PXb, and the region of the second pixel PXb may be larger or wider than a region of the third pixel PXc.

The first pixel PXa, the second pixel PXb, and the third pixel PXc may include a first electrode E1$a$, a second electrode E1$b$, and a third electrode E1$c$, respectively. Each of the first electrodes E1$a$, E1$b$, and E1$c$ may include an extension connected to the pixel circuit unit (not shown). The first pixel PXa, the second pixel PXb, and the third pixel PXc may include a first emission layer ELa, a second emission layer ELb, and a third emission layer ELc, respectively. The first pixel PXa, the second pixel PXb, and the third pixel PXc may include a first emission layer ELa, a second emission layer ELb, and a third emission layer ELc, respectively. The first emission layer ELa may be larger or wider than the second emission layer ELb, and the second emission layer ELb may be larger or wider than the third emission layer ELc. The first pixel PXa, the second pixel PXb, and the third pixel PXc may each include a second electrode (not shown). The second electrode may be disposed over the entire display area DA. The first electrode E1$a$, the first emission layer E1$a$, and the second electrode may form (or collectively define) a light emitting diode of the first pixel PXa, the second electrode E1$b$, the second emission layer ELb, and the second electrode may form a light emitting diode of the second pixel PXb, and the third electrode E1$c$, the third emission layer ELc, and the second electrode may form a light emitting diode of the third pixel PXc. The first electrodes E1$a$, E1$b$, and E1$c$ may be anodes of the light emitting diodes, and the second electrode may be a cathode of the light emitting diodes. The first electrodes E1$a$, E1$b$, and E1$c$ may be referred to as pixel electrodes, and the second electrode may be referred to as a common electrode. A light emitting region of each of the pixels PXa, PXb, and PXc may be substantially equivalent to or smaller than a corresponding region of the regions of the emission layers ELa, ELb, and ELc.

When the pixels PXa, PXb, and PXc are driven, the first electrodes E1$a$, E1$b$, and E1$c$ may be initialized by applying an initialization voltage for each frame. Due to the area difference between the first emission layer ELa, the second emission layer ELb, and the third emission layer ELc, a capacitance difference may occur between the light emitting diodes of the pixels PXa, PXb, and PXc. Accordingly, when the first electrodes E1$a$, E1$b$, and E1$c$ are initialized, an initial luminance difference may occur between the pixels PXa, PXb, and PXc. In an embodiment, the pixel circuits of the pixels PXa, PXb, and PXc may be designed differently or have different pixel structure from each other to prevent the initial difference in luminance between the pixels PXa, PXb, and PXc. This will hereinafter be described in detail with reference to FIG. 3 to FIG. 5.

Figure 3:
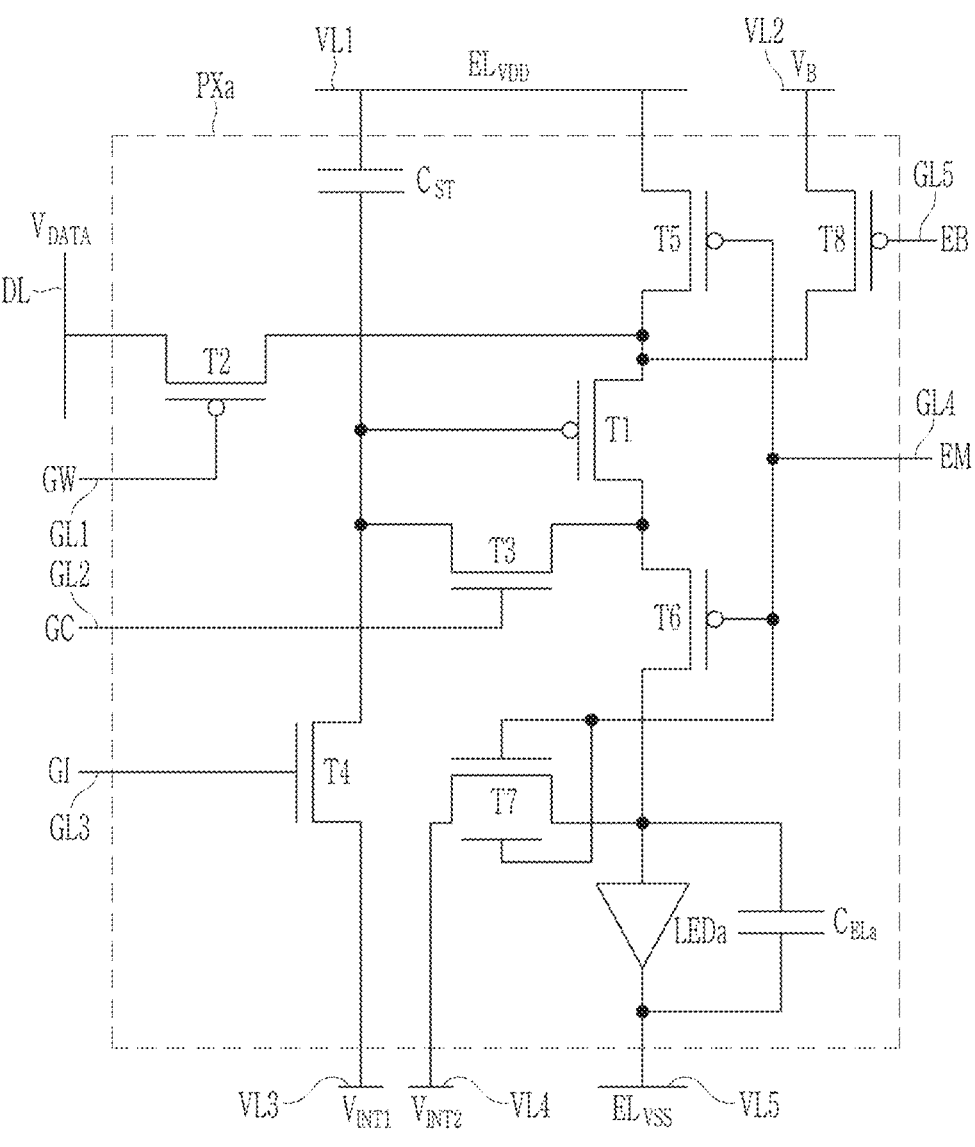
FIG. 3, FIG. 4, and FIG. 5 each are a circuit diagram of a pixel of a light emitting display device according to an embodiment.
Figure 4:
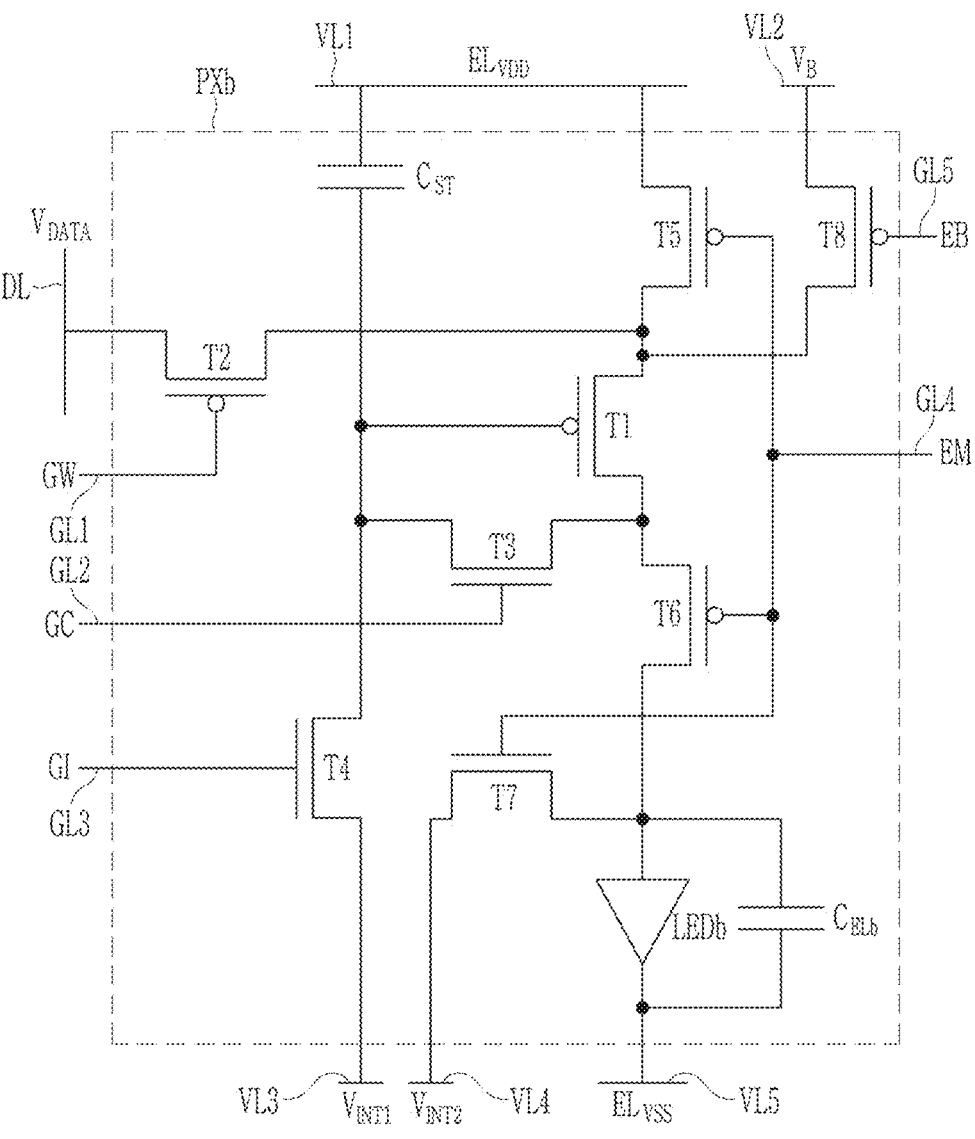
Figure 5:
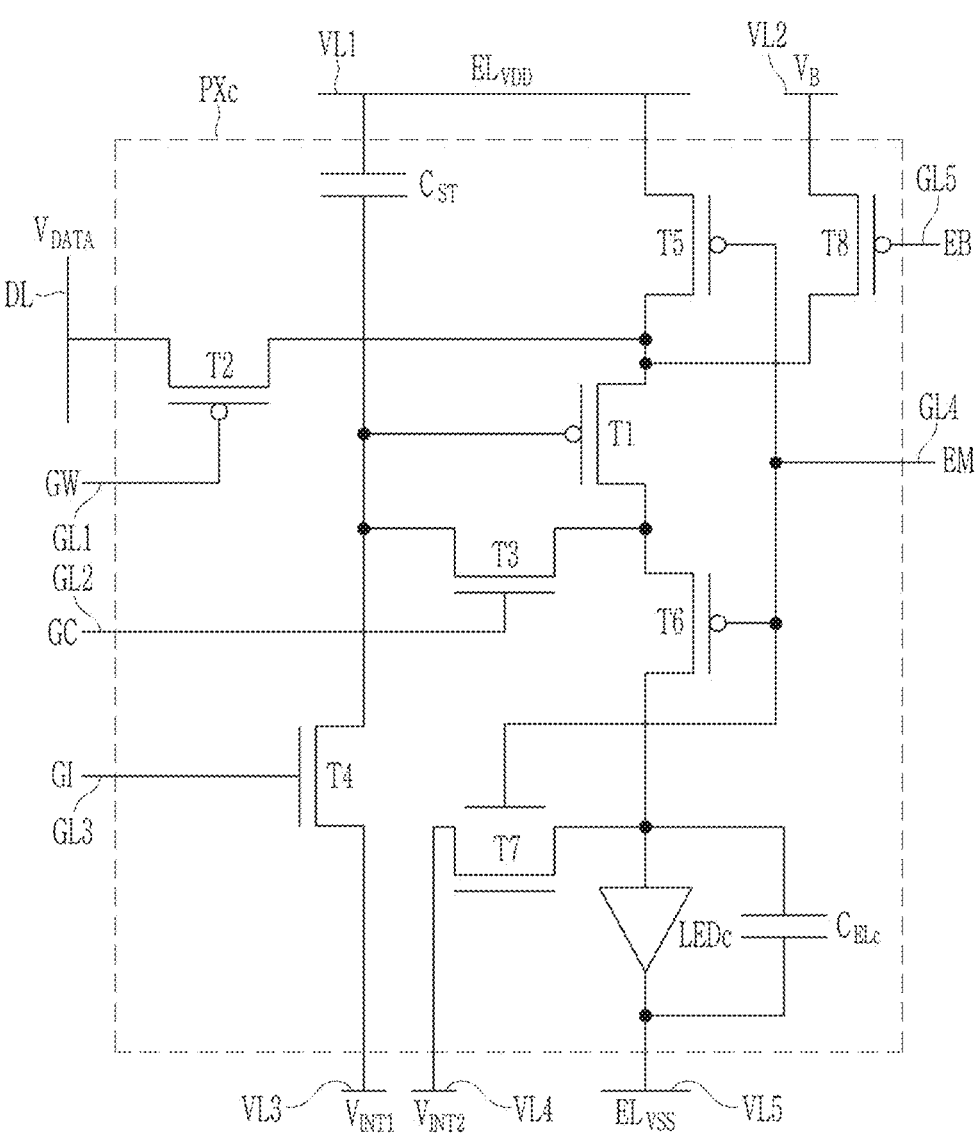

FIG. 3, FIG. 4, and FIG. 5 each are a circuit diagram of a pixel of a light emitting display device according to an embodiment.

Pixels PXa, PXb, and PXc illustrated in FIG. 3, FIG. 4, and FIG. 5 may correspond to the first pixel PXa, the second pixel PXb, and the third pixel PXc of FIG. 2. First, the first pixel PXa shown in FIG. 3 will be described, and the second pixel PXb and the third pixel PXc illustrated in FIG. 4 and FIG. 5 will mainly be described with differences from the first pixel PXa.

Referring to FIG. 3, in an embodiment, the first pixel PXa may include a first light emitting diode LEDa and a first pixel circuit portion connected thereto. The first pixel circuit portion may include transistors T1 to T8 and a storage capacitor $C_{ST}$. Several signal lines GL1-GL5, DL, and VL1-VL5 may be connected to the first pixel circuit portion.

The signal lines GL1-GL5, DL, and VL1-VL5 may include gate lines GL1 to GL5, a data line DL, and voltage lines VL1 to VL5. The gate lines GL1 to GL5 may be electrically connected to the gate driver, and the data line DL may be electrically connected to the data driver. The gate lines GL1 to GL5 may include a first scan line GL1, a second scan line GL2, an initialization control line GL3, a light emission control line GL4, and a bias control line GL5. The voltage lines VL1 to VL5 may include a driving voltage line VL1, a bias voltage line VL2, a first initialization voltage line VL3, a second initialization voltage line VL4, and a common voltage line VL5. The driving voltage line VL1, the bias voltage line VL2, the first initialization voltage line VL3, the second initialization voltage line VL4, and the common voltage line VL5 may be connected to a voltage generator.

The transistors T1 to T8 may include a first transistor T1, a second transistor T2, a third transistor T3, a fourth transistor T4, a fifth transistor T5, a sixth transistor T6, a seventh transistor T7, and an eighth transistor T8. The transistors T1 to T8 may be implemented as thin film transistors. The transistors T1 to T8 may each include a gate electrode, a first electrode, and a second electrode. Depending on the type and/or operating conditions of the transistors T1 to T8, one of the first and second electrodes may be a source electrode and the other thereof may be a drain electrode. The second to eighth transistors T2 to T8 may receive gate signals through gate lines GL1 to GL5.

The first scan line GL1 may transmit a first scan signal GW to the second transistor T2. The second scan line GL2 may transmit a second scan signal GC to the third transistor T3. The first scan signal GW and the second scan signal GC may have opposite polarities to each other. In an embodiment, for example, when a high voltage is applied to the first scan line GL1, a low voltage may be applied to the second scan line GL2.

The initialization control line GL3 may transmit an initialization control signal GI to the fourth transistor T4. The light emission control line GL4 may transmit a light emission control signal EM to the fifth transistor T5, the sixth transistor T6, and the seventh transistor T7. The bias control line GL5 may transmit a bias control signal EB to the eighth transistor T8. The data line DL may transmit a data voltage VDATA. The driving voltage line VL1 may transmit a driving voltage $EL_{VDD}$ (also referred to as a first power source voltage or a high-potential power source voltage). The bias voltage line VL2 may transmit the bias voltage VB. The first initialization voltage line VL3 may transmit a first initialization voltage $V_{INT1}$, the second initialization voltage line VL4 may transmit a second initialization voltage $V_{INT2}$, and the common voltage line VL5 may transmit a common voltage $EL_{VSS}$ (also referred to as a second power source voltage or a low-potential power source voltage). The luminance of the first light emitting diode LEDa may be adjusted based on the magnitude of the data voltage VDATA applied to the first pixel PXa. The driving voltage $EL_{VDD}$, the bias voltage VB, the first initialization voltage $V_{INT1}$, the second initialization voltage $V_{INT2}$, and the common voltage $EL_{VSS}$ may each be a direct current (DC) voltage having a predetermined level.

Regarding the transistors T1 to T8, the first transistor T1, which is a driving transistor, may be a P-type transistor and may include a polycrystalline semiconductor. The first transistor T1 may be a transistor that adjusts the magnitude of the driving current output to a first electrode of the first light emitting diode LEDa based on the data voltage VDATA applied to a gate electrode of the first transistor T1. The gate electrode of the first transistor T1 may be connected to a first electrode of the storage capacitor $C_{ST}$. The first electrode of the first transistor T1 may be connected to a second electrode of the second transistor T2, and may be connected to the driving voltage line VL1 via the fifth transistor T5. The second electrode of the first transistor T1 may be connected to the first electrode of the first light emitting diode LEDa via the sixth transistor T6.

The second transistor T2, which is a switching transistor, may be a P-type transistor and may include a polycrystalline semiconductor. A gate electrode of the second transistor T2 may be connected to the first scan line GL1, the first electrode of the second transistor T2 may be connected to the data line DL, and a second electrode of the second transistor T2 may be connected to the first electrode of the first transistor T1. When the second transistor T2 is turned on by a gate-on voltage (low voltage) of the first scan signal GW transmitted through the first scan line GL1, the data voltage VDATA transmitted through the data line DL is transmitted to the first electrode of the first transistor T1. The second transistor T2 may be referred to as a switching transistor.

The third transistor T3 may be an N-type transistor and may include an oxide semiconductor. The third transistor T3 may electrically connect the second electrode and the gate electrode of the first transistor T1 in response to the second scan signal GC received through the second scan line GL2. As a result, a compensation voltage, which is the data voltage VDATA that is changed after passing through the first transistor T1, may be transmitted to the first electrode of the storage capacitor $C_{ST}$. The third transistor may be referred to as a compensation transistor. The gate electrode of the third transistor T3 may be connected to the second scan line GL2, and the first electrode of the third transistor T3 may be connected to the second electrode of the first transistor T1. The second electrode of the third transistor T3 may be connected to the first electrode of the storage capacitor $C_{ST}$ and the gate electrode of the first transistor T1. When the third transistor T3 is turned on by a gate-on voltage (high voltage) of the second scan signal GC received through the second scan line GL2, the third transistor T3 may connect the gate electrode of the first transistor T1 and the second electrode of the first transistor T1. A voltage applied to the gate electrode of the first transistor T1 may be stored in the storage capacitor $C_{ST}$, and the storage capacitor $C_{ST}$ may maintain the voltage of the gate electrode of the first transistor T1 constant for one frame.

The fourth transistor T4 may be an N-type transistor and may include an oxide semiconductor. The fourth transistor T4 may initialize the gate electrode of the first transistor T1 and the first electrode of the storage capacitor $C_{ST}$ to a first initialization voltage $V_{INT1}$. The fourth transistor T4 may be referred to as a first initialization transistor. A gate electrode of the fourth transistor T4 may be connected to the initialization control line GL3, and a first electrode of the fourth transistor T4 may be connected to the first initialization voltage line VL3. A second electrode of the fourth transistor T4 may be connected to the first electrode of the storage capacitor $C_{ST}$ and the gate electrode of the first transistor T1. When the fourth transistor T4 is turned on by a gate-on voltage (high voltage) of the initialization control signal GI received through the initialization control line GL3, the first initialization voltage $V_{INT1}$ may be applied to the gate electrode of the first transistor T1 and the first electrode of the storage capacitor $C_{ST}$.

The fifth transistor T5 may be a P-type transistor and may include a polycrystalline semiconductor. The fifth transistor T5 may transmit the driving voltage $EL_{VDD}$ applied through the driving voltage line VL1 to the first transistor T1. A gate electrode of the fifth transistor T5 may be connected to the light emission control line GL4, a first electrode of the fifth transistor T5 may be connected to the driving voltage line VL1, and a second electrode of the fifth transistor T5 may be connected to the first electrode of the first transistor T1.

The sixth transistor T6 may be a P-type transistor and may include a polycrystalline semiconductor. The sixth transistor T6 may transmit the driving current output from the first transistor T1 to the first light emitting diode LEDa. A gate electrode of the sixth transistor T6 may be connected to the light emission control line GL4, a first electrode of the sixth transistor T6 may be connected to the second electrode of the first transistor T1, and a second electrode of the sixth transistor T6 may be connected to the first electrode of the first light emitting diode LEDa. When the fifth transistor T5 and the sixth transistor T6 are turned on by a gate-on voltage (low voltage) of the light emission control signal EM, a driving current may flow to the first light emitting diode LEDa. The fifth transistor T5 and the sixth transistor T6 may be referred to as a first light emission control transistor and a second light emission control transistor, respectively.

The seventh transistor T7 may be an N-type transistor and may include an oxide semiconductor. The seventh transistor T7 may initialize the first electrode of the first light emitting diode LEDa. The seventh transistor T7 may be referred to as a second initialization transistor. The seventh transistor T7 may include a first gate electrode and a second gate electrode respectively disposed above and below a semiconductor layer (also referred to as an active layer). First and second gate electrodes of the seventh transistor T7 may be connected to the light emission control line GL4, the first electrode of the seventh transistor T7 may be connected to the first electrode of the first light emitting diode LEDa, and the second electrode of the seventh transistor T7 may be connected to the second initialization voltage line VL4. The first gate electrode and the second gate electrode may be electrically connected to each other. The seventh transistor T7 may be a transistor of a double gate mode or a double gate mode transistor in which a gate-on voltage is applied to both the first gate electrode and the second gate electrode. The light emission control signal EM may be used as a gate signal of the seventh transistor T7. When the gate-on voltage (high voltage) of the light emission control signal EM is applied to the first and second gate electrodes and thus the seventh transistor T7 is turned on, the second initialization voltage $V_{INT2}$ may be applied to the first electrode of the first light emitting diode LEDa. Accordingly, a capacitor $C_{ELa}$ of the first light emitting diode LEDa may be initialized to a voltage value corresponding to the difference between the second initialization voltage $V_{INT2}$ and the common voltage $EL_{VSS}$.

The eighth transistor T8 may be a P-type transistor and may include a polycrystalline semiconductor. A gate electrode of the eighth transistor T8 may be connected to the bias control line GL5, a first electrode of the eighth transistor T8 may be connected to the bias voltage line VL2, and a second electrode of the eighth transistor T8 may be connected to the first electrode of the first transistor T1. When the eighth transistor T8 is turned on by a gate-on voltage (low voltage) of the bias control signal EB, a bias voltage VB may be applied to the first electrode of the first transistor T1. Accordingly, it is possible to control a current (driving current) between the first electrode and the second electrode of the first transistor T1. The eighth transistor T8 may be referred to as a bias transistor.

The second electrode of the storage capacitor $C_{ST}$ may be connected to the driving voltage line VL1. The second electrode of the first light emitting diode LEDa may be connected to a common voltage line VL5 that transmits the common voltage $EL_{VSS}$.

Referring to FIG. 4, in an embodiment, the second pixel PXb may include a second light emitting diode LEDb and a second pixel circuit portion connected thereto. The second pixel circuit portion of the second pixel PXb is substantially the same as the first pixel circuit portion shown in FIG. 3 except for the seventh transistor T7.

The seventh transistor T7 that initializes the first electrode of the second light emitting diode LEDb may be an N-type transistor and may include an oxide semiconductor. The seventh transistor T7 may include a first gate electrode and a second gate electrode respectively disposed above and below the semiconductor layer. A first gate electrode of seventh transistor T7 may be connected to the light emission control line GL4, a first electrode of seventh transistor T7 may be connected to the first electrode of a first light emitting diode LEDa, and a second electrode of seventh transistor T7 may be connected to the second initialization voltage line VL4. The second gate electrode of the seventh transistor T7 may be electrically floating or in an electrically floating state. Alternatively, the second gate electrode of the seventh transistor T7 in the second pixel circuit portion may be omitted, that is, the seventh transistor T7 may include only the first gate electrode without including the second gate electrode. The seventh transistor T7 may be a first gate mode transistor in which a gate-on voltage is applied only to the first gate electrode. When the gate-on voltage (high voltage) of the light emission control signal EM is applied to the first gate electrode and the seventh transistor T7 is turned on, the second initialization voltage $V_{INT2}$ may be applied to the first electrode of the second light emitting diode LEDb. Accordingly, the capacitor $C_{ELb}$ of the second light emitting diode LEDb may be initialized to a voltage value corresponding to the difference between the second initialization voltage $V_{INT2}$ and the common voltage $EL_{VSS}$.

Referring to FIG. 5, in an embodiment, the third pixel PXc may include a third light emitting diode LEDc and a third pixel circuit portion connected thereto. The third pixel circuit portion of the third pixel PXc is substantially the same as the first pixel circuit portion shown in FIG. 3 except for the seventh transistor T7.

The seventh transistor T7 that initializes a first electrode of the third light emitting diode LEDc may be an N-type transistor, and may include an oxide semiconductor. The seventh transistor T7 may include a first gate electrode and a second gate electrode respectively disposed above and below the semiconductor layer. A second gate electrode of the seventh transistor T7 may be connected to the light emission control line GL4, a first electrode of seventh transistor T7 may be connected to the first electrode of the first light emitting diode LEDa, and a second electrode of seventh transistor T7 may be connected to the second initialization voltage line VL4. The first gate electrode of the seventh transistor T7 may be electrically floating or in an electrically floating state. Alternatively, the first gate electrode of the seventh transistor T7 in the second pixel circuit portion may be omitted, that is, the seventh transistor T7 may include only the second gate electrode without including the first gate electrode. The seventh transistor T7 may be a second gate mode transistor to which a gate-on voltage is applied only to the second gate electrode. When the gate-on voltage (high voltage) of the light emission control signal EM is applied to the second gate electrode and the seventh transistor T7 is turned on, the second initialization voltage $V_{INT2}$ may be applied to the first electrode of the third light emitting diode LEDc. Accordingly, a capacitor $C_{ELc}$ of the third light emitting diode LEDc may be initialized to a voltage value corresponding to the difference between the second initialization voltage $V_{INT2}$ and the common voltage $EL_{VSS}$.

In an embodiment, capacitance $C_{ELa}$ of the first light emitting diode LEDa may be greater than capacitance $C_{ELb}$ of the second light emitting diode LEDb, and capacitance $C_{ELb}$ of the second light emitting diode LEDb may be greater than capacitance $C_{ELc}$ of the third light emitting diode LEDc. Accordingly, although a second initialization voltage $V_{INT2}$ of a same magnitude is applied to the light emitting diodes LEDa, LEDb, and LEDc at a same timing, the response in the first pixel PXa may be slower than the response in the second pixel PXb, and the response in the second pixel PXb may be slower than the response in the third pixel PXc. This is because a time constant ($\tau$) of a current ($I_{ON}$) flowing through the seventh transistor T7 is proportional to the capacitance ($C_{EL}$) of the light emitting diode as shown in the following equation.

$$\tau = \frac{C_{EL} \cdot (V_{E1} - V_{INT2})}{I_{ON}}$$

Here, $V_{E1}$ denotes a voltage of a first electrode of the light emitting diode when the second initialization voltage $V_{INT2}$ is applied.

In such an embodiment, when the first electrodes E1a, E1b, and E1c of the light emitting diodes LEDa, LEDb, and LEDc are initialized, an initial luminance difference may occur between the pixels PXa, PXb, and PXc due to the difference in the response of the pixels PXa, PXb, and PXc. This may deteriorate a variable refresh rate characteristic at a low grayscale, or worsen color shift and/or black visual perception at a low grayscale. In an embodiment, the seventh transistors T7 of the pixel circuit portions of the pixels PXa, PXb, and PXc are operated or designed in different modes, such that the response difference due to the difference in capacitances $C_{ELa}$, $C_{ELb}$, and $C_{ELc}$ of the light emitting diodes LEDa, LEDb, and LEDc is reduced or improved, thereby preventing or reducing the image quality defect.

In an embodiment, as described above, the third transistor T3 and the fourth transistor T4 may include a polycrystalline semiconductor and may be provided as P-type transistors. In an embodiment, as shown in FIGS. 3 to 5, a pixel circuit portion includes eight transistors T1 to T8 and a single storage capacitor $C_{ST}$, but the number of transistors, the number of capacitors, and their connection relationship may be variously changed.

Figure 6:
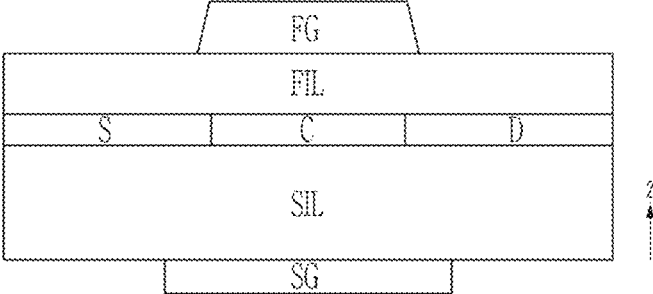
FIG. 6 schematically illustrates a cross-sectional structure of a transistor used as a seventh transistor of a pixel in a light emitting display device according to an embodiment.
Figure 7:
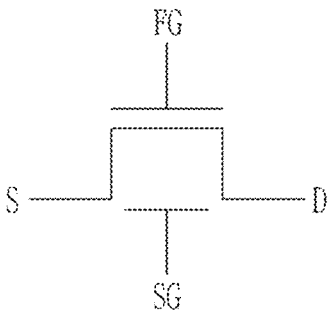
FIG. 7 shows a circuit diagram of the transistor illustrated in FIG. 6.

FIG. 6 schematically illustrates a cross-sectional structure of a transistor used as a seventh transistor of a pixel in a light emitting display device according to an embodiment, and FIG. 7 shows a circuit diagram of the transistor illustrated in FIG. 6.

Referring to FIG. 6 and FIG. 7, an embodiment of the seventh transistors of the pixels PXa, PXb, and PXc may have a double-gate structure. The double-gate transistor may include a first gate electrode FG and a second gate electrode SG disposed above and below a semiconductor layer including a first region S, a second region D, and a channel region therebetween. A first insulation layer FIL may be disposed between the semiconductor layer and the first gate electrode FG, and a second insulation layer SIL may be disposed between the semiconductor layer and the second gate electrode SG. The second insulation layer SIL may be thicker than the first insulation layer FIL.

Figure 8:
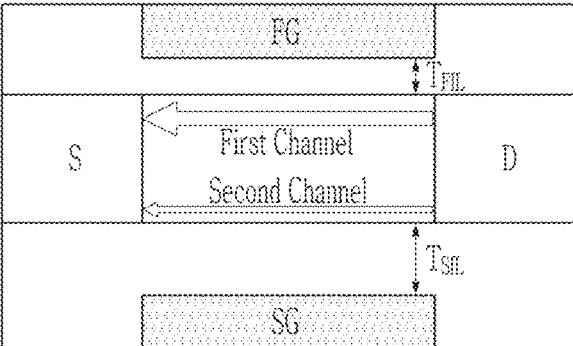
FIG. 8, FIG. 9, and FIG. 10 are schematic views that illustrate operation of the transistor shown in FIG. 6.
Figure 9:
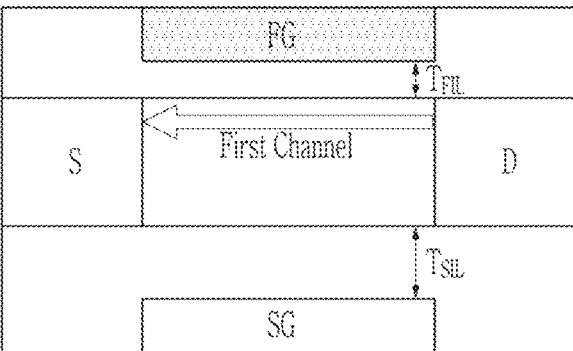
Figure 10:
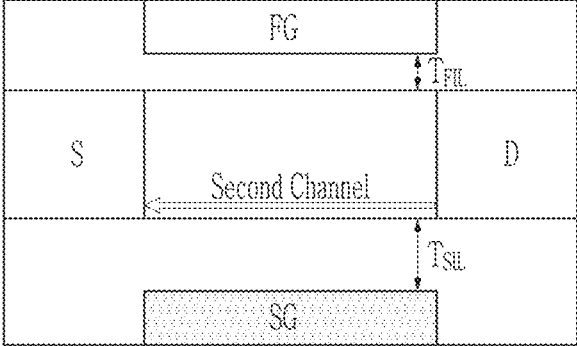

FIG. 8, FIG. 9, and FIG. 10 are schematic views that illustrate operation of the transistor shown in FIG. 6.

The double-gate transistor may be used or operated in a double gate mode or an independent gate mode. Referring to FIG. 8, a same gate signal may be applied to both the first gate electrode FG and the second gate electrode SG in the double gate mode. A first channel may be formed in an upper portion of the channel region by a gate-on voltage applied to the first gate electrode FG, and a second channel may be formed in a lower portion of the channel region by a gate-on voltage applied to the second gate electrode SG. Referring to FIG. 9, when agate-on voltage is applied only to the first gate electrode FG in the first gate mode, a first channel may be formed in the upper part of the channel region. Referring to FIG. 10, when a gate-on voltage is applied only to the second gate electrode SG in the second gate mode, a second channel May be formed in the upper part of the channel region.

In such an embodiment, since a thickness $T_{FIL}$ of the first insulation layer FIL is thinner than a thickness $T_{SIL}$ of the second insulation layer SIL, the first channel may be thicker than the second channel. Therefore, the channel thickness in the double gate mode may be thicker than the channel thickness in the first gate mode in which the gate signal is applied only to the first gate electrode FG, and the channel thickness in the second gate mode may be thicker than the channel thickness in the second gate mode in which the gate signal is applied to the second gate electrode SG. In an embodiment, a response difference due to capacitance differences $C_{ELa}$, $C_{ELb}$, and $C_{ELc}$ of the light emitting diodes LEDa, LEDb, and LEDc may be improved by operating the seventh transistor T7 of the first pixel PXa in the double gate mode, operating the seventh transistor T7 of the second pixel PXb in the first gate mode, and operating the seventh transistor T7 of the third pixel PXc in the second gate mode.

Figure 11:
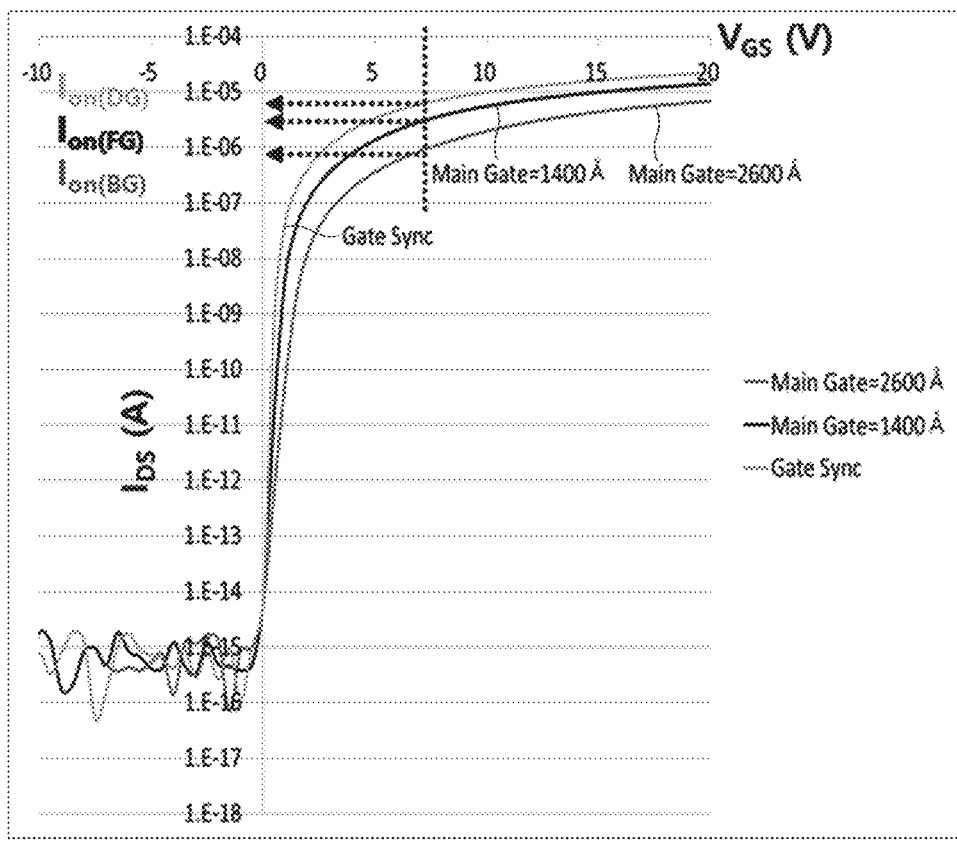
FIG. 11 is a graph that shows a voltage-current characteristic according to a mode of a seventh transistor in a light emitting display device according to an embodiment.

FIG. 11 is a graph that shows a voltage-current characteristic according to a mode of a seventh transistor in a light emitting display device according to an embodiment.

In FIG. 11, a first curve (Gate Sync) shows a characteristic of the seventh transistor T7 of the first pixel PXa, which is in the double gate mode, a second curve (Main Gate=1400 Å) is a characteristic of the seventh transistor T7 of the second pixel PXb, which is in the first gate mode, and a third curve (Main Gate=2600 Å) is a characteristic of the seventh transistor T7 of the third pixel PXc, which is in the second gate mode. In the simulation, the first insulation layer FIL has a thickness of 140 nanometers (nm), the second insulation layer SIL has a thickness of 260 nm, and the semiconductor layer contains an indicum gallium zinc oxide (IGZO). At the same gate-source voltage $V_{GS}$, a current $I_{DS}$ is the largest in the double gate mode and the smallest in the second gate mode. When the current $I_{DS}$ is large, a time constant T is small, and thus by changing the mode of the double-gate transistor with different thicknesses of the first insulation layer FIL and the second insulation layer SIL, the response difference due to the capacitance differences $C_{ELa}$, $C_{ELb}$, and $C_{ELc}$ of the light emitting diodes LEDa, LEDb, and LEDc may be improved.

Figure 12:
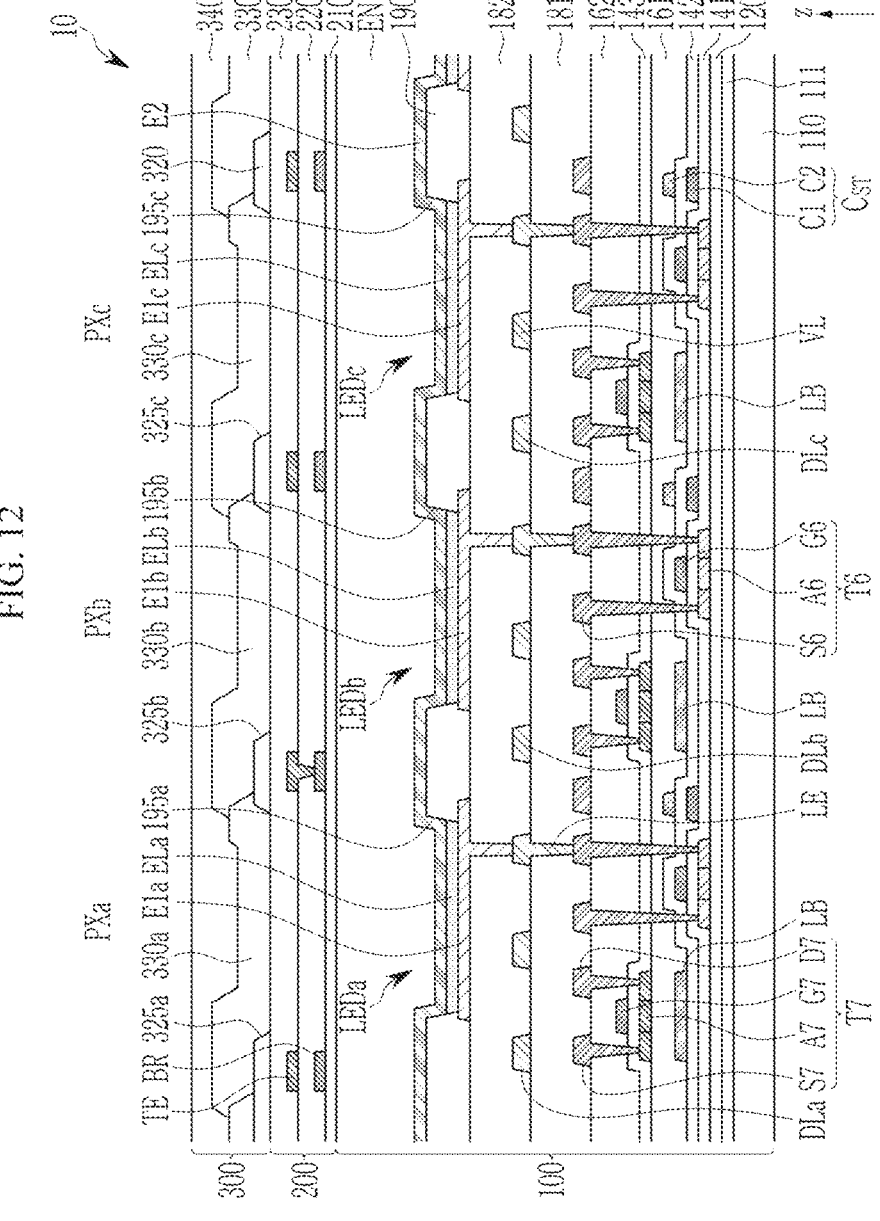
FIG. 12 is a schematic cross-sectional view of the display panel according to an embodiment.

FIG. 12 is a schematic cross-sectional view of the display panel according to an embodiment.

FIG. 12 may schematically illustrate a cross-sectional structure of a portion of the display panel 10 including the pixels PXa, PXb, and PXc shown in FIG. 3, FIG. 4, and FIG. 5, and may illustrate a pixel area approximately corresponding to three pixels PXa, PXb, and PXc. In an embodiment, the display panel 10 may include a display portion 100, a touch portion 200, and an anti-reflection portion 300.

The display portion 100 may include a substrate 110, transistors T6 and T7 formed on the substrate 110, a storage capacitor $C_{ST}$, and light emitting diodes LEDa, LEDb, and LEDc. FIG. 12 illustrates the sixth transistor T6 and the seventh transistor T7 among the above-stated transistors T1 to T8, but the first transistor T1, the second transistor T2, the fifth transistor T5, and the eighth transistor T8 may have a stack structure substantially equivalent to that of the sixth transistor T6, and the third transistor T3 and the fourth transistor T4 may have a stack structure substantially equivalent to that of the seventh transistor T7.

The substrate 110 may be a flexible substrate including a polymer such as a polyimide, a polyamide, or polyethylene terephthalate. In an embodiment, the substrate 110 may be a glass substrate.

A barrier layer 111 that prevents penetration of moisture, oxygen, or the like may be disposed on the substrate 110. The barrier layer 111 may include an inorganic insulation material such as a silicon nitride ($SiN_x$), a silicon oxide ($SiO_x$), a silicon oxynitride ($SiO_xN_y$), or the like, and may be defined by a single layer or multiple layers, that is, have a single layer structure or a multilayer structure.

A buffer layer 120 may be disposed on the barrier layer 111. When the semiconductor layer A6 is formed on the buffer layer 120, the buffer layer 120 blocks impurities from the substrate 110 to improve the characteristics of the semiconductor layer A6, and the stress of the semiconductor layer A6 can be released by flattening the surface of the substrate 110. The buffer layer 120 may include an inorganic insulating material such as a silicon oxide, a silicon nitride, or a silicon oxynitride. In an embodiment, the buffer layer 120 may include amorphous silicon.

The semiconductor layer A6 may be disposed on the buffer layer 120. The semiconductor layer A6 may include a first region, a second region, and a channel region between these regions. The semiconductor layer A6 may include polysilicon.

The first gate insulation layer 141 may be disposed on the semiconductor layer A6. The first gate insulation layer 141 may include an inorganic insulation material such as a silicon nitride ($SiN_x$), a silicon oxide ($SiO_x$), a silicon oxynitride ($SiO_xN_y$), or the like, and may be defined by a single layer or multiple layers.

A first gate conductive layer that may include a gate electrode G6, a first electrode C1 of the storage capacitor $C_{ST}$, or the like may be disposed on the first gate insulation layer 141. The first gate conductive layer may include molybdenum (Mo), aluminum (Al), copper (Cu), titanium (Ti) or the like, and may be defined by a single layer or multiple layers.

A second gate insulation layer 142 may be disposed on the first gate conductive layer. The second gate insulation layer 142 may include an inorganic insulating material such as a silicon nitride, a silicon oxide, or a silicon oxynitride, and may be defined by a single layer or multiple layers.

A second gate conductive layer that may include a light blocking layer LB, a second electrode C2 of the storage capacitor $C_{ST}$, or the like may be disposed on the second gate insulation layer 142. The second electrode C2, the first electrode C1, and the second gate insulation layer 142 therebetween may form the storage capacitor $C_{ST}$. The light blocking layer LB blocks external light from reaching a semiconductor layer A7, thereby preventing characteristic deterioration of the semiconductor layer A7. The light blocking layer LB may also function as a gate electrode of the seventh transistor T7. In an embodiment, for example, in the first pixel PXa and third pixel PXc, the light blocking layer LB is connected to the light emission control line GL4 to apply the light emission control signal EM thereto, and the seventh transistor T7 may be turned on by a gate-on voltage (high voltage) of the light emission control signal EM. The second gate conductive layer may include molybdenum (Mo), aluminum (Al), copper (Cu), titanium (Ti), or the like, and may be defined by a single layer or multiple layers.

A first interlayer insulation layer 161 may be disposed on the second gate conductive layer. The first interlayer insulation layer 161 may include an inorganic insulating material such as a silicon nitride, a silicon oxide, or a silicon oxynitride, and may be defined by a single layer or multiple layers. In an embodiment where the first interlayer insulation layer 161 has a multilayer structure, a lower layer may include a silicon nitride, and an upper layer may include a silicon oxide. The second insulation layer SIL shown in FIG. 6 may correspond to the first interlayer insulation layer 161.

The semiconductor layer A7 may be disposed on the first interlayer insulation layer 161. The semiconductor layer A7 may overlap the light blocking layer LB. The semiconductor layer A7 may include a first region, a second region, and a channel region between first and second regions. The semiconductor layer A7 may include an oxide semiconductor. The semiconductor layer A7 may include at least one of zinc (Zn), indium (In), gallium (Ga), and tin (Sn). In an embodiment, for example, the semiconductor layer A7 may include IGZO.

A third gate insulation layer 143 may be disposed on the semiconductor layer A7. The third gate insulation layer 143 may include an inorganic insulating material such as a silicon nitride, a silicon oxide, or a silicon oxynitride, and may be defined by a single layer or multiple layers. The first insulation layer FIL shown in FIG. 6 may correspond to the third gate insulation layer 143. The third gate insulation layer 143 may have a thinner thickness than the first interlayer insulation layer 161.

A third gate conductive layer that may include a gate electrode G7 or the like may be disposed on the third gate insulation layer 143. In the first pixel PXa, the gate electrode G7 may be electrically connected to the light blocking layer LB. In the second pixel PXb, the gate electrode G7 may be electrically floating or in an electrically floating state. The third gate conductive layer may include molybdenum (Mo), aluminum (Al), copper (Cu), titanium (Ti), or the like, and may be defined by a single layer or multiple layers. In an embodiment, for example, the third gate conductive layer may include a lower layer including titanium and an upper layer including molybdenum, and the lower layer may prevent diffusion of fluorine (F), which is an etching gas, during dry etching of the upper layer.

A second interlayer insulation layer 162 may be disposed on the third gate conductive layer. The second interlayer insulation layer 162 may include an inorganic insulating material such as a silicon nitride, a silicon oxide, or a silicon oxynitride, and may be defined by a single layer or multiple layers. The second interlayer insulation layer 162 may include, for example, a lower layer including a silicon nitride and an upper layer including a silicon oxide.

A first data conductive layer that may include first electrodes S6 and S7, second electrodes D6 and D7, and a gate line GL may be disposed on the second interlayer insulation layer 162. The first electrode S6 and the second electrode D6 may be respectively connected to the first region and the second region of the semiconductor layer A6 through contact holes defined or formed in the insulation layers 141, 142, 161, 143, and 162. The first electrode S7 and the second electrode D7 may be respectively connected to the first region and the second region of the semiconductor layer A7 through contact holes defined or formed in the insulation layers 143 and 162. The gate line GL may be a first scan line GL1, a second scan line GL2, an initialization control line GL3, a light emission control line GL4 and/or a bias control line GL5. The first data conductive layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), or the like, and may be defined by a single layer or multiple layers. In an embodiment, for example, the first data conductive layer may include a lower layer containing a refractory metal such as molybdenum, chromium, tantalum, titanium, or the like, a middle layer containing a low resistivity metal such as aluminum, copper, and silver, and an upper layer containing a refractory metal. In an embodiment, for example, the first data conductive layer may have a triple layer structure such as titanium (Ti)-aluminum (Al)-titanium (Ti).

The semiconductor layer A6, the gate electrode G6, the first electrode S6, and the second electrode D6 may form the sixth transistor T6. The semiconductor layer A7, the gate electrode G7, the first electrode S7, and the second electrode D7 may form the seventh transistor T7. In the first pixel PXa, the light blocking layer LB is electrically connected to the gate electrode G7 to function as a lower gate electrode of the seventh transistor T7. In the third pixel PXc, instead of the gate electrode G7, the light blocking layer LB may function as the gate electrode of the seventh transistor T7.

A first planarization layer 181 may be disposed on the first data conductive layer. The first planarization layer 181 may be an organic insulation layer. In an embodiment, for example, first planarization layer 181 may include an organic insulating material such as general-purpose polymers such as poly(methyl_methacrylate) or polystyrene, polymer derivatives with phenolic groups, acryl-based polymers, imide-based polymers (e.g., polyimide), acryl-based polymers, siloxane-based polymers, or the like.

A second data conductive layer that may include data lines DLa, DLb, and DLc, a voltage line VL, a connection electrode LE, or the like may be disposed on the first planarization layer 181. The voltage line VL may be a driving voltage line VL1, a bias voltage line VL2, a first initialization voltage line VL3, a second initialization voltage line VL4, and/or a common voltage line VL5. The connection electrode LE may be connected to the second electrode D6 of the sixth transistor T6 through a contact hole defined or formed in the first planarization layer 181. The second data conductive layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), or the like, and may be defined by a single layer or multiple layers. In an embodiment, for example, the second data conductive layer may have a triple layer structure such as titanium/aluminum/titanium (Ti/Al/Ti).

A second planarization layer 182 may be disposed on the second data conductive layer. The second planarization layer 182 may be an organic insulating layer. In an embodiment, for example, the second planarization layer 182 may include an organic insulating material such as general-purpose polymers such as poly(methyl_methacrylate) or polystyrene, polymer derivatives with phenolic groups, acryl-based polymers, imide-based polymers, acryl-based polymers, siloxane-based polymers, or the like.

A pixel conductive layer including first electrodes E1*a*, E1*b*, and E1*c* may be disposed on the second planarization layer 182. The first electrodes E1*a*, E1*b*, and E1*c* may be connected to the connection electrode LE through a contact hole defined or formed in the second planarization layer 182. The first electrodes E1*a*, E1*b*, and E1*c* are electrically connected to the second electrode D6 to receive a driving current for controlling the luminance of the light emitting diodes LEDa, LEDb, and LEDc. The pixel conductive layer may include a metal such as silver (Ag), lithium (Li), calcium (Ca), aluminum (Al), magnesium (Mg), or gold (Au). The pixel conductive layer may include a transparent conductive oxide (TCO) such as an indium tin oxide (ITO) or an indium zinc oxide (IZO). The pixel conductive layer may be multi-layered, and may have a triple-layer structure of ITO-silver (Ag)-ITO.

A pixel defining layer 190 may be disposed on the pixel conductive layer. The pixel defining layer 190 may have openings 195*a*, 195*b*, and 195*c* overlapping the first electrodes E1*a*, E1*b*, and E1*c*, that is, the openings 195*a*, 195*b*, and 195*c* are defined through the pixel defining layer 190 to overlap the first electrodes E1*a*, E1*b*, and E1*c*. The pixel defining layer 190 may include an organic insulating material such as general-purpose polymers such as poly(methyl_ methacrylate) or polystyrene, polymer derivatives with phenolic groups, acryl-based polymers, imide-based polymers, acryl-based polymers, siloxane-based polymers, or the like. The pixel defining layer 190 may be a black pixel defining layer including a black dye or pigment. The black pixel defining layer may improve the contrast ratio and prevent reflection by the underlying metal layer.

The emission layers ELa, ELb, and ELc may be disposed on the first electrodes E1*a*, E1*b*, and E1*c*. The emission layers ELa, ELb, and ELc may be disposed within openings 195*a*, 195*b*, and 195*c*, but may include portions disposed outside the openings 195*a*, 195*b*, and 195*c*. The emission layers ELa, ELb, and ELc may include a material layer that emits light of one of primary colors such as red, green, and blue. In addition to the emission layers ELa, ELb, and ELc, at least one selected from a hole injection layer, a hole transport layer, an electron transport layer, and an electron injection layer may be disposed on the first electrodes E1*a*, E1*b*, and E1*c*.

A second electrode E2 may be disposed on the emission layers ELa, ELb, and ELc and the pixel defining layer 190. The second electrode E2 may be provided in common to all pixels PXa, PXb, and PXc. The second electrode E2 may include a metal such as calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), lithium (Li), or the like. The second electrode E2 may include a TCO such as ITO or IZO.

The first electrode E1*a*, the first emission layer E1*a*, and the second electrode E2 may form the first light emitting diode LEDa and the capacitor $C_{ELa}$. The second electrode E1*b*, the second emission layer ELb, and the second electrode E2 may form the second light emitting diode LEDb and the capacitor $C_{ELb}$. The third electrode E1*c*, the third emission layer ELc, and the second electrode E2 may form the third light emitting diode LEDc and the capacitor $C_{ELc}$.

An encapsulation layer EN may be disposed on the second electrode E2. The encapsulation layer EN encapsulates light emitting diodes LEDa, LEDb, and LEDc to prevent penetration of moisture and oxygen from the outside. The encapsulation layer EN may be a thin film encapsulation layer including at least one inorganic layer and at least one organic layer. In an embodiment, for example, the encapsulation layer EN may have a triple-layer structure of an inorganic layer, an organic layer, and an inorganic layer.

The touch portion 200 may be disposed on the encapsulation layer EN.

The touch portion 200 may include a first insulation layer 210 disposed on the encapsulation layer EN. The first insulation layer 210 may cover the encapsulation layer EN to protect the encapsulation layer EN and prevent moisture permeation. The first insulation layer 210 may reduce parasitic capacitance between the second electrode E2 and a touch electrode TE.

A first touch conductive layer that may include a bridge BR or the like may be disposed on the first insulation layer 210, and a second insulation layer 220 may be disposed on the first touch conductive layer. A second touch conductive layer that may include the touch electrode TE may be disposed on the second insulation layer 220, and a passivation layer 230 may be disposed on the second touch conductive layer.

The touch electrode TE may include first touch electrodes and second touch electrodes forming a mutual sensing capacitor. The bridge BR may electrically connect the first touch electrodes or the second touch electrodes. In an embodiment, for example, first touch electrodes that are adjacent while being separated may be connected to the bridge BR through contact holes defined formed in the second insulation layer 220, and electrically connected through the bridge BR.

The first insulation layer 210 and the second insulation layer 220 may include an inorganic insulating material such as a silicon nitride, a silicon oxide, or a silicon oxynitride, and may be defined by a single layer or multiple layers. The passivation layer 230 may include an inorganic insulating material such as a silicon nitride, a silicon oxide, a silicon oxynitride, or the like, or an organic material such as an acryl-based polymer and an imide-based resin.

The first touch electrode layer and the second touch electrode layer may have a mesh shape with openings overlapping pixels the PXa, PXb, and PXc. The first touch electrode layer and the second touch electrode layer each may include a metal such as aluminum (Al), copper (Cu), titanium (Ti), molybdenum (Mo), silver (Ag), chromium (Cr), nickel (Ni), or the like.

The anti-reflection portion 300 may be disposed on the touch portion 200. The anti-reflection portion 300 may include a light blocking layer 320 and color filters 330*a*, 330*b*, and 330*c*.

The light blocking layer 320 may overlap the pixel defining layer 190 of the display portion 100 and may be narrower than the pixel defining layer 190. The light blocking layer 320 may have openings 325*a*, 325*b*, and 325*c* overlapping the openings 195*a*, 195*b*, and 195*c* of the pixel defining layer 190.

The color filters 330*a*, 330*b*, and 330*c* may be disposed on the light blocking layer 320. The color filters 330*a*, 330*b*, and 330*c* may include a first color filter 330*a* that transmits a first color, a second color filter 330*b* that transmits a second color, and a third color filter 330*c* that transmits a third color. An overcoat layer 340 may be disposed on the color filters 330_a_, 330_b_, and 330_c_.

The anti-reflection portion 300 may prevent external light incident from the outside from being visually recognized by being reflected by a wire or the like. The light blocking layer 320 and the color filters 330_a_, 330_b_, and 330_c_ may be combined to function as an anti-reflection layer. In such a structure, a polarization layer as an anti-reflection layer may not be used, and thus the light output efficiency can be increased and the thickness of the display panel 10 can be reduced.

The stacked structure of the display panel 10 and the arrangement of constituent elements can be changed in various ways.

Figure 13:
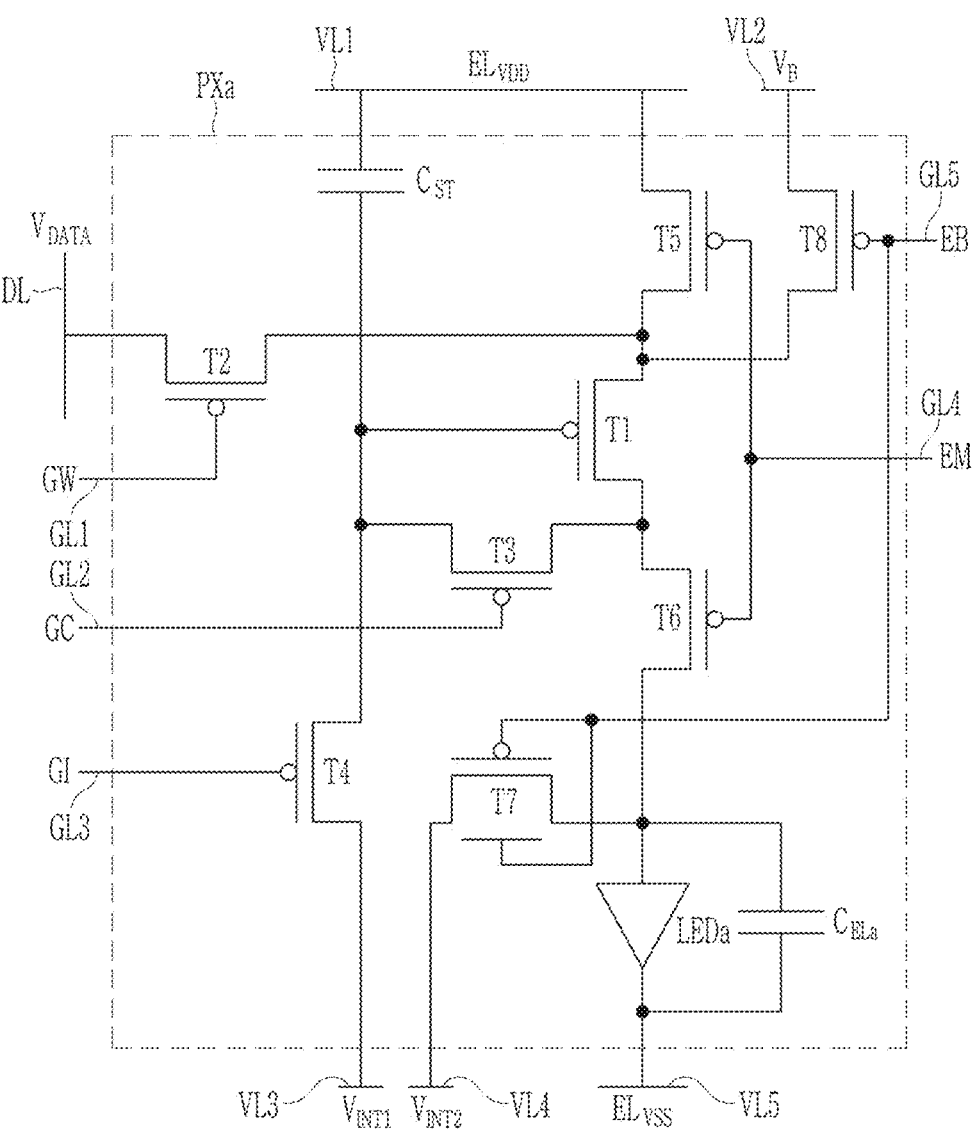
FIG. 13, FIG. 14, and FIG. 15 each are a circuit diagram of a pixel of a light emitting display device according to an embodiment.
Figure 14:
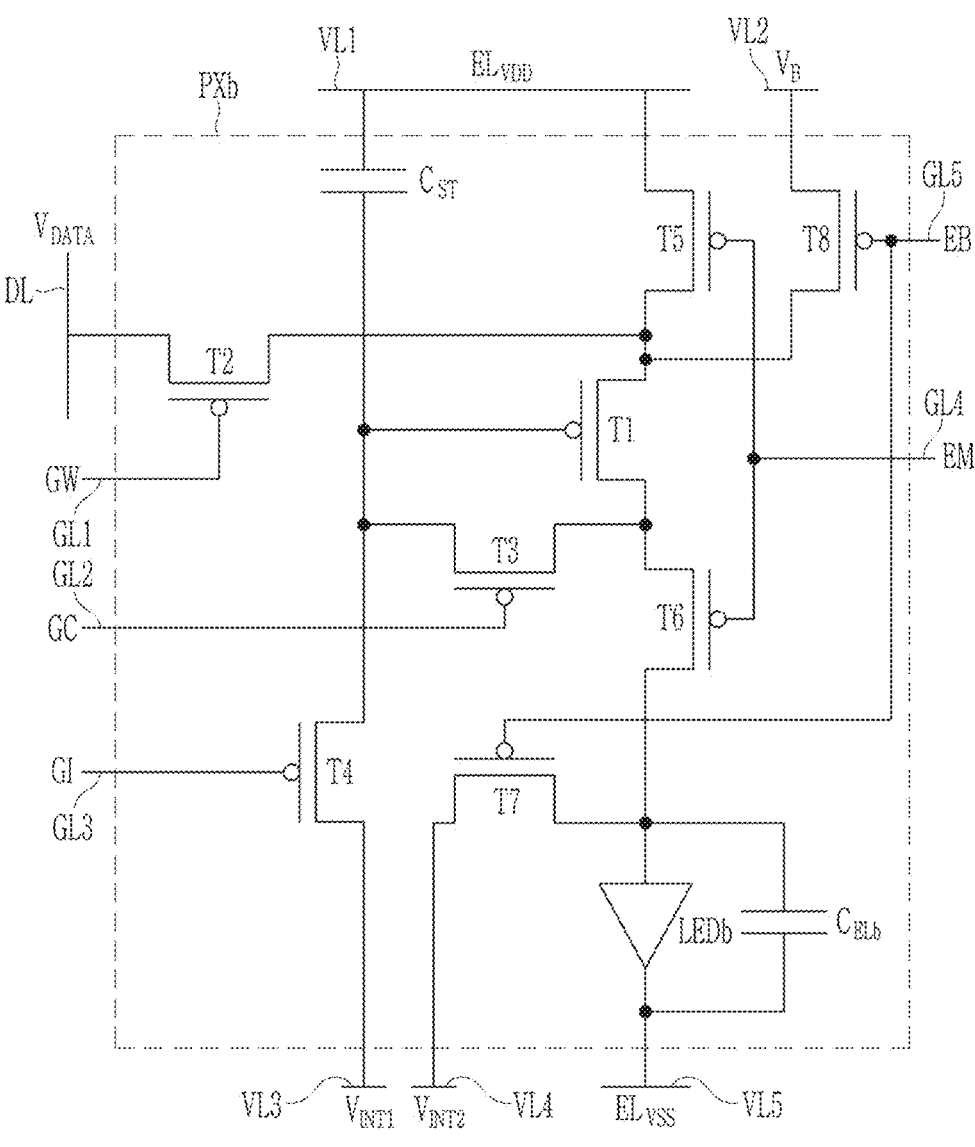
Figure 15:
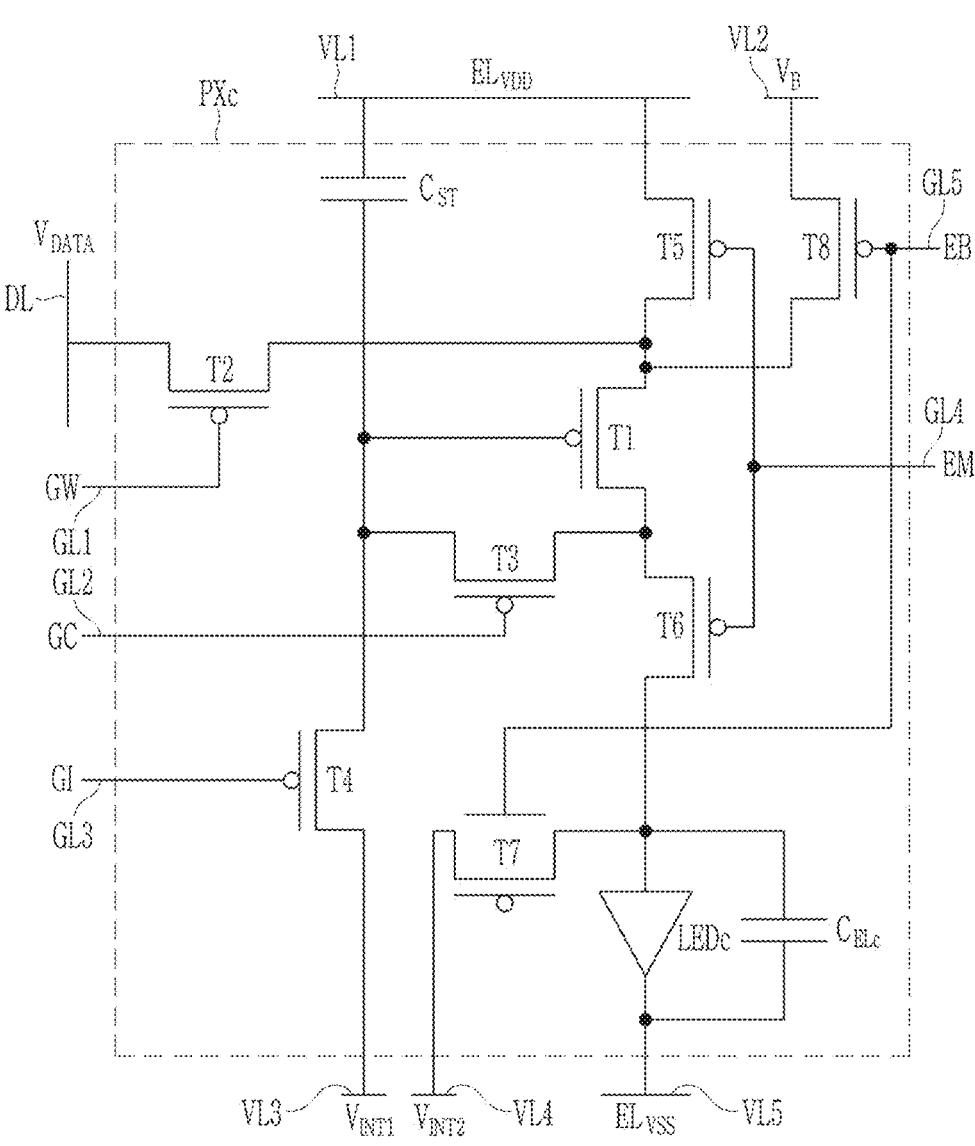

FIG. 13, FIG. 14, and FIG. 15 each are a circuit diagram of a pixel of a light emitting display device according to an embodiment.

Pixels PXa, PXb, and PXc shown in FIG. 13, FIG. 14, and FIG. 15 may correspond to the first pixel PXa, the second pixel PXb, and the third pixel PXc shown in FIG. 2. A first pixel PXa shown in FIG. 13 will be described first, and a second pixel PXb and a third pixel PXc shown in FIG. 14 and FIG. 15 will be mainly described with differences from the first pixel PXa.

Referring to FIG. 13, an embodiment of the first pixel PXa is substantially the same as the first pixel PXa shown in FIG. 3 except for a third transistor T3, a fourth transistor T4, and a seventh transistor T7 of a first pixel circuit portion. In such an embodiment, the third transistor T3, the fourth transistor T4, and the seventh transistor T7 may be P-type transistors and may include a polycrystalline semiconductor. The third transistor T3 is turned on by a gate-on voltage (low voltage) of a second scan signal GC received through a second scan line GL2 to connect a gate electrode of a first transistor T1 and a second electrode of the first transistor T1. The fourth transistor T4 is turned on by a gate-on voltage (low voltage) of an initialization control signal GI received through an initialization control line GL3, and a first initialization voltage $V_N$T1 may be applied to a gate electrode of the first transistor T1 and a first electrode of a storage capacitor $C_{ST}$. The seventh transistor T7 may include a first gate electrode and a second gate electrode respectively disposed above and below a semiconductor layer, the first gate electrode may be referred to as an upper gate electrode, and the second gate electrode may be referred to as a lower gate electrode. The first gate electrode and the second gate electrode may be connected to a bias control line GL5. The first gate electrode and the second gate electrode may be electrically connected. A bias control signal EB may be used as a gate signal of the seventh transistor T7. The seventh transistor T7 is turned on by a gate-on voltage (low voltage) of the bias control signal EB, and thus a second initialization voltage $V_{INT2}$ may be applied to a first electrode of a first light emitting diode LEDa. Accordingly, a capacitor $C_{ELa}$ of a first light emitting diode LEDa may be initialized to a voltage value corresponding to the difference between the second initialization voltage $V_{INT2}$ and the common voltage $EL_{VSS}$.

Referring to FIG. 14, in an embodiment, a second pixel PXb may include a second light emitting diode LEDb and a second pixel circuit portion connected thereto. The second pixel circuit portion of the second pixel PXb shown in FIG. 14 is substantially the same as the first pixel circuit portion shown in FIG. 13 except for a seventh transistor T7.

The seventh transistor T7 may be a P-type transistor and may include a polycrystalline semiconductor. The seventh transistor T7 may be in an independent gate mode. The seventh transistor T7 may include a first gate electrode and a second gate electrode respectively disposed above and below a semiconductor layer. A first gate electrode of the seventh transistor T7 may be connected to a bias control line GL5. The second gate electrode of the seventh transistor T7 may be electrically floating or in an electrically floating state. Alternatively, the seventh transistor T7 may include only a first gate electrode without including a second gate electrode. The seventh transistor T7 may be turned on by the gate-on voltage (low voltage) of the bias control signal EB, and thus the second initialization voltage $V_{INT2}$ may be applied to the first electrode of the second light emitting diode LEDb. Accordingly, the capacitor $C_{ELb}$ of the second light emitting diode LEDb may be initialized to a voltage value corresponding to the difference between the second initialization voltage $V_{INT2}$ and the common voltage $EL_{VSS}$.

Referring to FIG. 15, the third pixel PXc may include a third light emitting diode LEDc and a third pixel circuit portion connected thereto. The third pixel circuit portion of the third pixel PXc is substantially the same as the first pixel circuit portion shown in FIG. 13 in the seventh transistor T7 forming the third pixel circuit portion.

The seventh transistor T7 may be a P-type transistor and may include a polycrystalline semiconductor. The seventh transistor T7 may be in an independent gate mode. The seventh transistor T7 may include a first gate electrode and a second gate electrode respectively disposed above and below the semiconductor layer. A second gate electrode of the seventh transistor T7 may be connected to a bias control line GL5, and a first gate electrode of the seventh transistor T7 may be electrically floating or in an electrically floating state. Alternatively, the seventh transistor T7 may include only the second gate electrode without including the first gate electrode. The seventh transistor T7 is turned on by a gate-on voltage (low voltage) of a bias control signal EB, and thus the second initialization voltage $V_{INT2}$ may be applied to a first electrode of the third light emitting diode LEDc. Accordingly, a capacitor $C_{ELc}$ of the third light emitting diode LEDc may be initialized to a voltage value corresponding to the difference between the second initialization voltage $V_{INT2}$ and the common voltage $EL_{VSS}$.

In such an embodiment, as described above, the transistors of the pixel circuit portions of the pixels PXa, PXb, and PXc may all be formed as P-type transistors. Even in such a configuration, it is possible to improve the response difference caused by differences in the capacitances $C_{ELa}$, $C_{ELb}$, and $C_{ELc}$ of the light emitting diodes LEDa, LEDb, and LEDc and the resulting image quality defect by operating or designing the seventh transistor T7 of the pixel circuit portions of the pixels PXa, PXb, and PXc in different modes.

Figure 16:
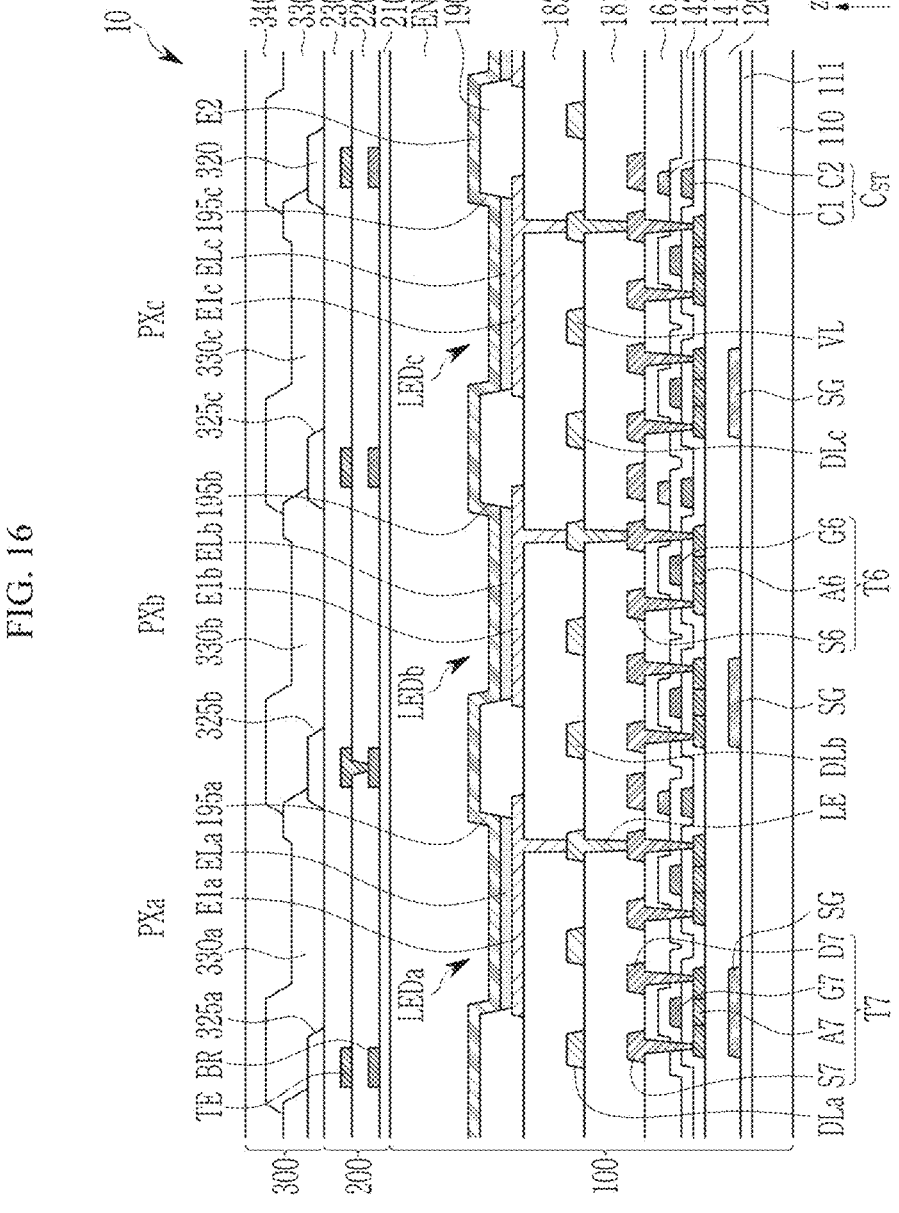
FIG. 16 is a schematic cross-sectional view of a display panel according to an embodiment.

FIG. 16 is a schematic cross-sectional view of a display panel according to an embodiment.

FIG. 16 may schematically illustrate a cross-sectional structure of a portion of a display panel including the pixels PXa, PXb, and PXc shown in FIG. 13, FIG. 14, and FIG. 15, and may illustrate a pixel region approximately corresponding to three pixels PXa, PXb, and PXc.

Referring to FIG. 16, a display panel 10 is substantially the same as the display panel 10 shown in FIG. 2 except for a display portion 100, and any repetitive detailed description of the same configurations as those described above will hereinafter be simplified or omitted.

The display portion 100 may include a substrate 110, transistors T6 and T7 formed on the substrate 110, a storage capacitor $C_{ST}$, and light emitting diodes LEDa, LEDb, and LEDc. FIG. 16 illustrates the sixth transistor T6 and the seventh transistor T7 among the above-stated transistors T1 to T8, but the first transistor T1, the second transistor T2, the third transistor T3, the fourth transistor T4, the fifth transistor T5, and the eighth transistor T8 may have a stack structure substantially equivalent to that of the sixth transistor T6.

A barrier layer 111 may be disposed on the substrate 110. A second gate electrode SG of the seventh transistor T7 may be disposed on the barrier layer 111. In a first pixel PXa and a third pixel PXc, the second gate electrode SG is connected to a bias control line GL5 to receive a bias control signal EB, and the seventh transistor T7 is turned on by a gate-on voltage (low voltage) of the bias control signal EB.

A buffer layer 120 may be disposed on the second gate electrode SG. The second insulation layer SIL illustrated in FIG. 6 may correspond to the buffer layer 120.

Semiconductor layers A6 and A7 may be disposed on the buffer layer 120. The semiconductor layers A6 and A7 may include polysilicon. A first gate insulation layer 141 may be disposed on the semiconductor layers A6 and A7. The first insulation layer FIL illustrated in FIG. 6 may correspond to the first gate insulation layer 141. The first gate insulation layer 141 may have a thinner thickness than the buffer layer 120.

A first gate conductive layer that may include gate electrodes G6 and G7, a first electrode C1 of a storage capacitor $C_{ST}$, or the like may be disposed on the first gate insulation layer 141. In the first pixel PXa, the gate electrode G7 may be electrically connected to the second gate electrode SG. In the second pixel PXb, the gate electrode G7 may be electrically floating or in an electrically floating state.

A second gate insulation layer 142 may be disposed on the first gate conductive layer. A second gate conductive layer that may include a second electrode C2 of the storage capacitor $C_{ST}$ may be disposed on the second gate insulation layer 142. The second electrode C2, the first electrode C1, and the second gate insulation layer 142 therebetween may constitute the storage capacitor $C_{ST}$.

An interlayer insulation layer 161 may be disposed on the second gate conductive layer. A first data conductive layer that may include the first electrodes S6 and S7, the second electrodes D6 and D7, and the gate line GL may be disposed on the interlayer insulation layer 161. The first electrode S6 and the second electrode D6 may be respectively connected to a first region and a second region of a semiconductor layer A6 through contact holes defined or formed in the insulation layers 141, 142, and 161. The first electrode S7 and the second electrode D7 may be respectively connected to a first region and a second region of a semiconductor layer A7 through contact holes defined or formed in the insulation layers 141, 142, and 161.

The semiconductor layer A6, the gate electrode G6, the first electrode S6, and the second electrode D6 may form the sixth transistor T6. The semiconductor layer A7, the gate electrode G7, the first electrode S7, and the second electrode D7 may form the seventh transistor T7. In the first pixel PXa, the second gate electrode SG is electrically connected to the gate electrode G7 to function as a lower gate electrode of the seventh transistor T7. In the third pixel PXc, the second gate electrode SG may function as a gate electrode of the seventh transistor T7 instead of the gate electrode G7.

Other Configurations disposed over the first data conductive layer may be substantially equivalent to those shown in FIG. 12, and any repetitive detailed description thereof will be omitted.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A light emitting display device comprising:
a first pixel which displays a first color, wherein the first pixel comprises a first light emitting diode and a first pixel circuit portion connected to the first light emitting diode; and
a second pixel which displays a second color, wherein the second pixel comprises a second light emitting diode and a second pixel circuit portion connected to the second light emitting diode,
wherein the first pixel circuit portion comprises an initialization transistor which is connected to a first electrode of the first light emitting diode and transmits an initialization voltage, and the initialization transistor of the first pixel circuit portion comprises a first gate electrode and a second gate electrode which receive a gate-on voltage, and the first gate electrode and the second gate electrode of the first pixel circuit portion are disposed above and below a semiconductor layer of the initialization transistor of the first pixel circuit portion, respectively, and
wherein the second pixel circuit portion comprises an initialization transistor which is connected to a first electrode of the second light emitting diode and transmits the initialization voltage, and the initialization transistor of the second pixel circuit portion comprises a first gate electrode which receives the gate-on voltage.

2. The light emitting display device of claim 1, wherein the first gate electrode and the second gate electrode of the first pixel circuit portion are electrically connected to each other.

3. The light emitting display device of claim 1, wherein the first pixel circuit portion further comprises a light emission control transistor which transmits a driving current to the first light emitting diode, and the initialization transistor and the light emission control transistor of the first pixel circuit portion receive a same gate signal as each other.

4. The light emitting display device of claim 3, wherein the initialization transistor of the first pixel circuit portion is an N-type transistor, and the light emission control transistor is a P-type transistor.

5. The light emitting display device of claim 1, wherein the first pixel circuit portion further comprises a driving transistor which adjusts an intensity of a driving current output to the first light emitting diode and a bias transistor which applies a bias voltage to the driving transistor, and the initialization transistor and the bias transistor of the first pixel circuit portion receive a same gate signal as each other.

6. The light emitting display device of claim 5, wherein the initialization transistor and the bias transistor of the first pixel circuit portion are P-type transistors.

7. The light emitting display device of claim 1, further comprising:
a first insulation layer disposed between the first gate electrode of the first pixel circuit portion and the semiconductor layer of the initialization transistor of the first pixel circuit portion; and a second insulation layer disposed between the second gate electrode of the first pixel circuit portion and the semiconductor layer of the initialization transistor of the first pixel circuit portion, wherein the second insulation layer is thicker than the first insulation layer.

8. The light emitting display device of claim 1, wherein the first gate electrode of the second pixel circuit portion is disposed above a semiconductor layer of the initialization transistor of the second pixel circuit portion.

9. The light emitting display device of claim 8, wherein the initialization transistor of the second pixel circuit portion further comprises a second gate electrode which is disposed below the semiconductor layer of the initialization transistor of the second pixel circuit portion and is in an electrically floating state.

10. The light emitting display device of claim 1, wherein a light emitting region of the first pixel is larger than a light emitting region of the second pixel.

11. The light emitting display device of claim 1, further comprising:

a third pixel which displays a third color, wherein the third pixel comprises a third light emitting diode and a third pixel circuit portion connected to the third light emitting diode, wherein the third pixel circuit portion comprises an initialization transistor which is connected to a first electrode of the third light emitting diode and transmits the initialization voltage, the initialization transistor of the third pixel circuit portion comprises a second gate electrode which receives the gate-on voltage.

12. The light emitting display device of claim 11, wherein the second gate electrode of the third pixel circuit portion is disposed below a semiconductor layer of the initialization transistor of the third pixel circuit portion.

13. The light emitting display device of claim 12, wherein the initialization transistor of the third pixel circuit portion further comprises a first gate electrode which is disposed above the semiconductor layer of the initialization transistor of the third pixel circuit portion and is in an electrically floating state.

14. The light emitting display device of claim 11, wherein a light emitting region of the third pixel is smaller than a light emitting region of the second pixel.

15. A light emitting display device comprising:

a first pixel, a second pixel, and a third pixel which display different colors from each other, wherein each of the first pixel, the second pixel, and the third pixel comprises a light emitting diode and a pixel circuit portion connected to the light emitting diode, the pixel circuit portion comprises a transistor which transmits an initialization voltage to the light emitting diode, the transistor of the first pixel comprises an upper gate electrode and a lower gate electrode which are respectively disposed above and below a semiconductor layer thereof and receive a gate signal, the transistor of the second pixel comprises an upper gate electrode which is disposed above a semiconductor layer thereof and receives the gate signal, and the transistor of the third pixel comprises a lower gate electrode which is disposed below a semiconductor layer thereof and receives the gate signal.

16. The light emitting display device of claim 15, wherein a capacitance of the light emitting diode of the first pixel is greater than a capacitance of the light emitting diode of the second pixel, and the capacitance of the light emitting diode of the second pixel is greater than a capacitance of the light emitting diode of the third pixel.

17. The light emitting display device of claim 15, further comprising:

an upper insulation layer disposed between the upper gate electrode of the transistor of the first pixel and the semiconductor layer of the transistor of the first pixel; and a lower insulation layer disposed between the lower gate electrode of the transistor of the first pixel and the semiconductor layer of the transistor of the first pixel, wherein the lower insulation layer is thicker than the upper insulation layer.

18. The light emitting display device of claim 15, wherein the transistor of the second pixel further comprises a lower gate electrode which is disposed below the semiconductor layer of the transistor of the second pixel and is in an electrically floating state.

19. The light emitting display device of claim 18, wherein the transistor of the third pixel further comprises an upper gate electrode which is disposed above the semiconductor layer of the transistor of the third pixel and is in an electrically floating state.

\* \* \* \* \*